United States Patent
Takeda et al.

(10) Patent No.: US 10,873,029 B2
(45) Date of Patent: Dec. 22, 2020

(54) METHOD FOR PRODUCING VAPOR DEPOSITION MASK, VAPOR DEPOSITION MASK PREPARATION BODY, METHOD FOR PRODUCING ORGANIC SEMICONDUCTOR ELEMENT, METHOD FOR PRODUCING ORGANIC EL DISPLAY, AND VAPOR DEPOSITION MASK

(71) Applicant: Dai Nippon Printing Co., Ltd., Tokyo (JP)

(72) Inventors: Toshihiko Takeda, Tokyo (JP); Kumiko Hokari, Tokyo (JP); Yasuko Sone, Tokyo (JP); Katsunari Obata, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/841,858

(22) Filed: Apr. 7, 2020

(65) Prior Publication Data
US 2020/0235299 A1 Jul. 23, 2020

Related U.S. Application Data

(63) Continuation of application No. 16/448,122, filed on Jun. 21, 2019, now Pat. No. 10,651,386, which is a
(Continued)

(30) Foreign Application Priority Data

Jul. 3, 2015 (JP) .................................. 2015-134805
Jul. 3, 2015 (JP) .................................. 2015-134806
Jun. 28, 2016 (JP) .................................. 2016-128114

(51) Int. Cl.
*H01L 21/00* (2006.01)
*H01L 51/00* (2006.01)
(Continued)

(52) U.S. Cl.
CPC ........ *H01L 51/0011* (2013.01); *C23C 14/042* (2013.01); *H01L 51/56* (2013.01)

(58) Field of Classification Search
CPC .... H01L 51/56; H01L 51/0011; C23C 14/042
(Continued)

(56) References Cited

U.S. PATENT DOCUMENTS

2009/0252951 A1 10/2009 Ozaki et al.
2010/0294423 A1 11/2010 Takesue et al.
(Continued)

FOREIGN PATENT DOCUMENTS

JP   2008-036895 A1   2/2008
JP   2013-108143 A1   6/2013
(Continued)

OTHER PUBLICATIONS

International Search Report and Written Opinion (Application No. PCT/JP2016/069250) dated Sep. 27, 2016.

*Primary Examiner* — David S Blum
(74) *Attorney, Agent, or Firm* — Burr & Brown, PLLC

(57) ABSTRACT

A vapor deposition mask preparation body in which a metal mask is provided on one surface of a resin plate for obtaining a resin mask, and a protective sheet with peel strength not less than about 0.0004 N/10 mm and less than about 0.2 N/10 mm in conformity with JIS Z-0237:2009 is provided on the other surface of the resin plate is prepared, with respect to the vapor deposition mask preparation body, the resin plate is irradiated with laser light from the metal mask side to form a resin mask opening corresponding to a pattern to be produced by vapor deposition in the resin plate, and the protective sheet is peeled off from the resin mask in which the resin mask opening corresponding to the pattern to be produced by vapor deposition is formed.

15 Claims, 15 Drawing Sheets

Related U.S. Application Data continuation of application No. 15/739,844, filed as application No. PCT/JP2016/069250 on Jun. 29, 2016, now Pat. No. 10,396,283.

(51) Int. Cl.
  *C23C 14/04* (2006.01)
  *H01L 51/56* (2006.01)

(58) Field of Classification Search
  USPC .......................................................... 438/45
  See application file for complete search history.

(56) References Cited

U.S. PATENT DOCUMENTS

| | | |
|---|---|---|
| 2014/0199808 A1 | 7/2014 | Sugimoto et al. |
| 2015/0283651 A1 | 10/2015 | Kudo et al. |
| 2016/0293844 A1 | 10/2016 | Takeda et al. |
| 2018/0190906 A1 | 7/2018 | Takeda et al. |

FOREIGN PATENT DOCUMENTS

| | | |
|---|---|---|
| JP | 5288037 B2 | 9/2013 |
| JP | 2014-121720 A1 | 7/2014 |
| JP | 2014-133938 A1 | 7/2014 |
| JP | 2015-067891 A1 | 4/2015 |
| JP | 2015-067892 A1 | 4/2015 |
| WO | 2009/072538 A1 | 6/2009 |

VIEW SEEN FROM RESIN MASK SIDE

VIEW SEEN FROM RESIN MASK SIDE

US 10,873,029 B2

METHOD FOR PRODUCING VAPOR DEPOSITION MASK, VAPOR DEPOSITION MASK PREPARATION BODY, METHOD FOR PRODUCING ORGANIC SEMICONDUCTOR ELEMENT, METHOD FOR PRODUCING ORGANIC EL DISPLAY, AND VAPOR DEPOSITION MASK

CROSS REFERENCE TO RELATED APPLICATIONS

This application is a continuation of U.S. application Ser. No. 16/448,122, filed Jun. 21, 2019, now U.S. Pat. No. 10,651,386, which is a continuation of U.S. application Ser. No. 15/739,844, filed Dec. 26, 2017, now U.S. Pat. No. 10,396,283, issued Aug. 27, 2019, which is the National Stage of International Application No. PCT/JP2016/069250, filed Jun. 29, 2016, the entireties of which are incorporated herein by reference.

FIELD OF THE INVENTION

Embodiments of the present disclosure relate to a method for producing a vapor deposition mask, a vapor deposition mask preparation body, a method for producing an organic semiconductor element, a method for producing an organic EL display, and a vapor deposition mask.

BACKGROUND OF THE INVENTION

With upsizing of products using organic EL elements or increase in substrate sizes, a demand for upsizing is also growing with respect to vapor deposition masks, and the metal plates for use in production of the vapor deposition masks constituted of metals are also upsized. However, with the present metal processing technique, it is difficult to form openings in a large metal plate with high precision, which cannot respond to enhancement in definition of the openings. Moreover, in the case of a vapor deposition mask constituted of only a metal, the mass thereof also increases with upsizing, and the total mass including a frame also increases, which becomes a hindrance to handling.

Under such circumstances, in Patent Document 1, there is proposed a method for producing a vapor deposition mask including a metal mask in which slits (metal mask openings) are provided and a resin mask which is positioned on the surface of the metal mask and in which openings corresponding to a pattern to be produced by vapor deposition are arranged for a plurality of rows in the lengthwise direction and in the crosswise direction, the metal mask and the resin mask being stacked. According to the method for producing a vapor deposition mask proposed in Patent Document 1, opening precision of the openings of the resin mask by laser irradiation can be improved, and a vapor deposition mask capable of forming a vapor deposition pattern with high definition can be produced. Patent Document 2 to Patent Document 4 are documents relevant to the method for producing a vapor deposition mask proposed in Patent Document 1.

CITATION LIST

Patent Document

Patent Document 1: Japanese Patent No. 5288037
Patent Document 2: Japanese Patent Laid-Open No. 2015-67891
Patent Document 3: Japanese Patent Laid-Open No. 2014-133938
Patent Document 4: Japanese Patent Laid-Open No. 2015-67892

SUMMARY OF THE INVENTION

Technical Problem

A primary object of an embodiment of the present disclosure is to provide a method for producing a vapor deposition mask capable of simply producing a vapor deposition mask in excellent yield which can satisfy both high definition and lightweight even in upsizing, to provide a vapor deposition mask preparation body used in this method for producing a vapor deposition mask, to provide a method for producing an organic semiconductor element capable of producing an organic semiconductor element with excellent precision and a vapor deposition mask, and to provide a method for producing an organic EL display capable of producing an organic EL display with excellent precision.

Solution to Problem

According to an embodiment of the present disclosure, there is provided a method for producing a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, the method including: a step of preparing a vapor deposition mask preparation body in which the metal mask is provided on one surface of a resin plate for obtaining the resin mask, and a protective sheet with peel strength not less than about 0.0004 N/10 mm and less than about 0.2 N/10 mm in conformity with JIS Z-0237:2009 is provided on the other surface of the resin plate; a step of irradiating, with respect to the vapor deposition mask preparation body, the resin plate with laser light from the metal mask side to form the resin mask opening corresponding to the pattern to be produced by vapor deposition in the resin plate; and a step of peeling off the protective sheet from the resin mask in which the resin mask opening corresponding to the pattern to be produced by vapor deposition is formed.

Moreover, the vapor deposition mask preparation body may be a vapor deposition mask preparation body in which the metal mask is provided on one surface of a resin plate for obtaining the resin mask, and a plurality of the protective sheets are provided on the other surface of the resin plate.

Moreover, according to an embodiment of the present disclosure, there is provided a vapor deposition mask preparation body for obtaining a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, wherein the metal mask is provided on one surface of a resin plate for obtaining the resin mask, and a protective sheet with peel strength not less than about 0.0004 N/10 mm and less than about 0.2 N/10 mm in conformity with JIS Z-0237:2009 is provided on the other surface of the resin plate.

Moreover, according to an embodiment of the present disclosure, there is provided a vapor deposition mask preparation body for obtaining a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, wherein a metal plate for obtaining the metal mask is provided on one surface of a resin plate for obtaining the resin mask, and a protective sheet with peel strength not less than about 0.0004 N/10 mm and less than about 0.2 N/10 mm in conformity with JIS Z-0237:2009 is provided on the other surface of the resin plate.

Moreover, according to an embodiment of the present disclosure, there is provided a method for producing an organic semiconductor element, including a step of forming a vapor deposition pattern on a vapor deposition target using a frame-equipped vapor deposition mask in which a vapor deposition mask is fixed to a frame, wherein in the step of forming the vapor deposition pattern, the vapor deposition mask fixed to the frame is the vapor deposition mask produced by the aforementioned method for producing a vapor deposition mask.

Moreover, according to an embodiment of the present disclosure, there is provided a method for producing an organic EL display, wherein the organic semiconductor element produced by the aforementioned method for producing an organic semiconductor element is used.

Moreover, according to an embodiment of the present disclosure, there is provided a method for producing a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, the method including: a step of preparing a vapor deposition mask preparation body in which the metal mask is provided on one surface of a resin plate for obtaining the resin mask, and a protective sheet with self-adsorption and peelability is adsorbed on the other surface of the resin plate; a step of irradiating, with respect to the vapor deposition mask preparation body, the resin plate with laser light from the metal mask side to form the resin mask opening corresponding to the pattern to be produced by vapor deposition in the resin plate; and a step of peeling off the protective sheet from the resin mask in which the resin mask opening corresponding to the pattern to be produced by vapor deposition is formed.

Moreover, the protective sheet adsorbed on the other surface of the resin plate may be a protective sheet containing any one or both of a silicone-based resin and a urethane-based resin. Moreover, the vapor deposition mask preparation body may be a vapor deposition mask preparation body in which the metal mask is provided on one surface of a resin plate for obtaining the resin mask, and a plurality of the protective sheets are adsorbed on the other surface of the resin plate.

Moreover, according to an embodiment of the present disclosure, there is provided a vapor deposition mask preparation body for obtaining a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, wherein the metal mask is provided on one surface of a resin plate for obtaining the resin mask, and a protective sheet with self-adsorption and peelability is adsorbed on the other surface of the resin plate.

Moreover, according to an embodiment of the present disclosure, there is provided a vapor deposition mask preparation body for obtaining a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, wherein a metal plate for obtaining the metal mask is provided on one surface of a resin plate for obtaining the resin mask, and a protective sheet with self-adsorption and peelability is adsorbed on the other surface of the resin plate.

Moreover, according to an embodiment of the present disclosure, there is provided a method for producing an organic semiconductor element, including a step of forming a vapor deposition pattern on a vapor deposition target using a frame-equipped vapor deposition mask in which a vapor deposition mask is fixed to a frame, wherein in the step of forming the vapor deposition pattern, the vapor deposition mask fixed to the frame is the vapor deposition mask produced by the aforementioned method for producing a vapor deposition mask.

Moreover, according to an embodiment of the present disclosure, there is provided a method for producing an organic EL display, wherein the organic semiconductor element produced by the aforementioned method for producing an organic semiconductor element is used.

Moreover, according to an embodiment of the present disclosure, there is provided a vapor deposition mask including: a metal mask including a metal mask opening; and a resin mask including a resin mask opening, the metal mask being provided on one surface of the resin mask, wherein a protective sheet with peel strength not less than about 0.0004 N/10 mm and less than about 0.2 N/10 mm in conformity with JIS Z-0237:2009 is provided on the other surface of the resin mask.

Moreover, according to an embodiment of the present disclosure, there is provided a vapor deposition mask including: a metal mask including a metal mask opening; and a resin mask including a resin mask opening, the metal mask being provided on one surface of the resin mask, wherein a protective sheet with self-adsorption and peelability is adsorbed on the other surface of the resin mask.

Advantageous Effects

According to the method for producing a vapor deposition mask according to the present disclosure and the vapor deposition mask preparation body according to the present disclosure, a vapor deposition mask capable of satisfying both high definition and lightweight even in upsizing can be simply produced in excellent yield. Moreover, according to the method for producing an organic semiconductor element according to the present disclosure and the vapor deposition mask, an organic semiconductor element can be produced with excellent precision. Moreover, according to the method for producing an organic EL display according to the present disclosure, an organic EL display can be produced with excellent precision.

DETAILED DESCRIPTION OF THE INVENTION

Figure 1:
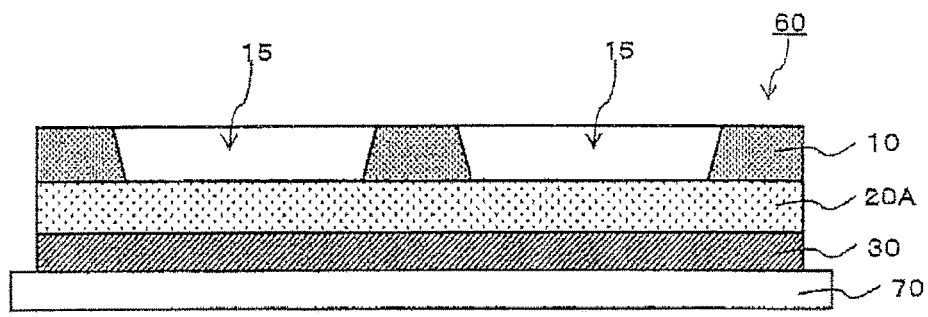
FIGS. 1(a)-(c) show an example of a method for producing a vapor deposition mask of an embodiment.
Figure 1:
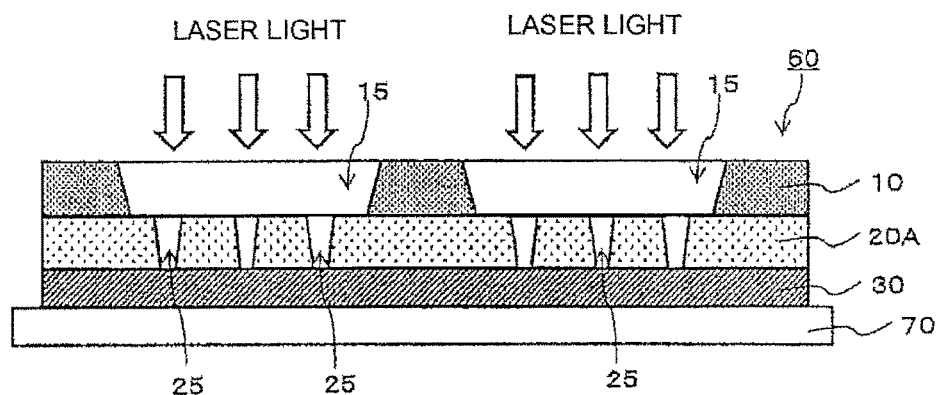
Figure 1:
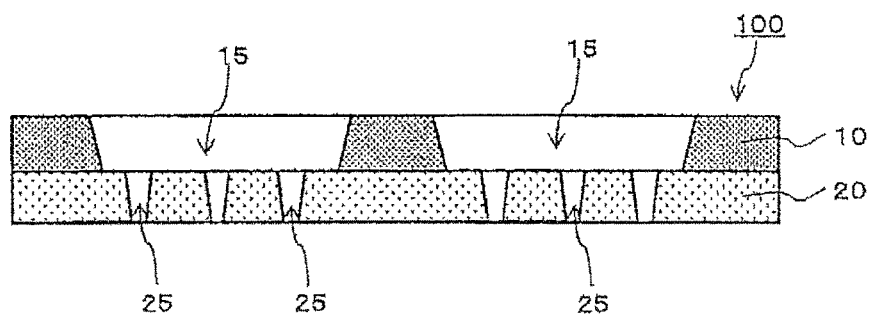

Hereafter, embodiments of the present invention are described with reference to the drawings and the like. Notably, embodiments of the present invention can be implemented in many different modes and should not be construed to be limited to the contents of description of embodiments exemplified below. Moreover, while in the drawings, there are cases where widths, thicknesses, shapes of individual parts are schematically presented as compared with those in actual modes for more clarity of the description, they are merely exemplary, not limiting interpretation of an embodiment of the present invention. Moreover, in the specification of the present application and the drawings, elements similar to those described regarding already shown drawings are sometimes given the same signs to properly omit their detailed description. Moreover, while the description is made using terms such as "upward", "downward" and the like for convenience of the description, the upward and downward directions may be reversed. The same holds true for the rightward and leftward directions.

<<Method for Producing Vapor Deposition Mask>>

Hereafter, a method for producing a vapor deposition mask according to an embodiment of the present disclosure is specifically described using the drawings. As shown in FIGS. 1 (a)-(c), the method for producing a vapor deposition mask according to an embodiment of the present disclosure is a method for producing a vapor deposition mask 100 including a metal mask 10 in which metal mask openings 15 are formed and a resin mask 20 in which resin mask openings 25 corresponding to a pattern to be produced by vapor deposition are formed at positions overlapping with the metal mask openings 15, the metal mask and the resin mask being stacked, and includes: as shown in FIG. 1(a), a step of preparing a vapor deposition mask preparation body 60 in which the metal mask 10 is provided on one surface of a resin plate 20A for obtaining the resin mask, and a protective sheet 30 with peel strength not less than about 0.0004 N/10 mm and less than about 0.2 N/10 mm in conformity with JIS Z-0237:2009 is provided on the other surface of the resin plate 20A; as shown in FIG. 1(b), a step of irradiating, with respect to the vapor deposition mask preparation body 60, the resin plate 20A with laser light from the metal mask 10 side to form the resin mask openings 25 corresponding to the pattern to be produced by vapor deposition in the resin plate 20A; and as shown in FIG. 1(c), a step of peeling off the protective sheet 30 from the resin mask 20 in which the resin mask openings 25 corresponding to the pattern to be produced by vapor deposition are formed, in other words, a step of peeling off the protective sheet 30 from the vapor deposition mask 100 which is a final production target.

The peel strength stated in the specification of the present application is a synonym of 180° peel adhesive force in conformity with JIS Z-0237:2009, and measurement of the peel strength can be performed in conformity with (Method 2): 180° Peel Adhesive Force with Respect to Back Surface in JIS Z-0237:2009. Specifically, using a test plate obtained by pasting a test tape (polyimide film (polyimide tape 5413, 3M Japan Limited) having a pressure-sensitive adhesive agent on its surface) on a stainless steel plate such that the stainless steel plate and the pressure-sensitive adhesive agent oppose each other, a protective sheet as a test piece is pasted on this polyimide film of the test plate, peel strength (relative to polyimide) in the occasion when the protective sheet as the test piece is peeled off at 180° from the polyimide film as the test plate is measured by the method in conformity with JIS Z-0237:2009, and thereby, the peel strength of the protective sheet can be measured. As a measurement machine which performs measurement of the peel strength, an electromechanical universal testing instrument (5900 series, Instron Japan Company Limited) is to be used.

Figure 2:
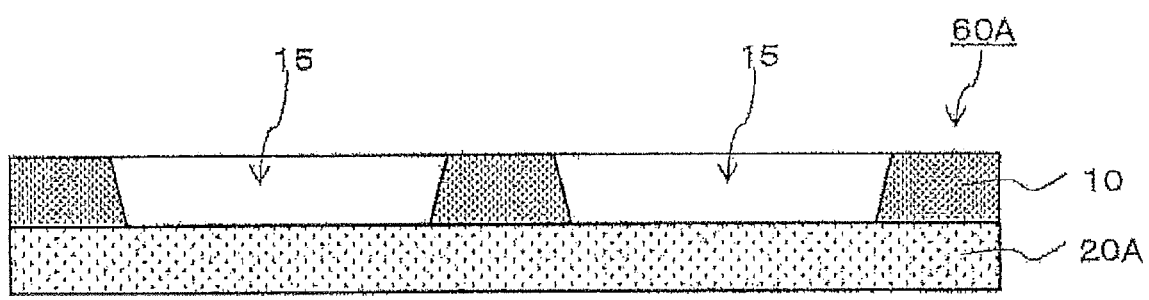
FIG. 2 is a schematic cross-sectional view exemplary showing a comparative vapor deposition mask.

Before the individual steps are described, a predominance of the method for producing a vapor deposition mask according to an embodiment of the present disclosure is described, exemplified by a case where a vapor deposition mask is produced using a "comparative vapor deposition mask preparation body 60A" that does not satisfy a requirement for the vapor deposition mask preparation body 60 used in the method for producing a vapor deposition mask according to an embodiment of the present disclosure. Notably, as shown in FIG. 2, the "comparative vapor deposition mask preparation body 60A" is different from the vapor deposition mask preparation body 60 (refer to FIG. 1(a)) used in the method for producing a vapor deposition mask according to an embodiment of the present disclosure only in that the protective sheet 30 is not provided on the other surface of the resin plate 20A.

Formation of resin mask openings in the resin plate 20A of the "comparative vapor deposition mask preparation body" and formation of the resin mask openings 25 in the resin plate 20A of the vapor deposition mask preparation body 60 used in the method for producing a vapor deposition mask according to an embodiment of the present disclosure are performed by irradiating the resin plate 20A with laser light from the metal mask 10 side to decompose the resin plate 20A.

Here, focusing on the stage of the middle of formation of the resin mask openings 25 under the resin plate 20A of the "comparative vapor deposition mask preparation body" being irradiated with laser light, in other words, the stage where recess parts to be the resin mask openings 25 in the final stage exist in the resin plate 20A, with the laser processing under irradiation with laser light progressing, the thickness from the bottom surface of the resin plate 20A to the bottom surfaces of the recess parts becomes thin, and strength of the recess parts and the resin plate 20A near the recess parts is decreasing. With this decrease in strength, immediately before formation of the resin mask openings 25, parts of the resin plate 20A tend to be chipped off, causing "burrs" and "rubble". Moreover, with the thickness from the bottom surface of the resin plate 20A to the bottom surfaces of the recess parts becoming thin, "burrs" and "rubble" caused by out-of-focus blur tend to arise. Specifically, due to out-of-focus blur, decomposition of the resin plate 20A with laser light is not normally performed, the case where "burrs" arise in edge parts of the resin mask openings 25 arises, and parts of the resin plate 20A that have not completely decomposed tend to remain as "rubble". Notably, the "rubble" stated in the specification of the present application is a synonym of "debris".

Moreover, when the "comparative vapor deposition mask preparation body" is placed on a processing stage 70 to form the resin mask openings 25 in the resin plate 20A of the "comparative vapor deposition mask preparation body", some gap is to exist between the processing stage 70 and the resin plate 20A of the "comparative vapor deposition mask preparation body", and this gap is also a factor of out-of-focus blur in the occasion of irradiation with laser light. Notably, in order to make the gap between the processing stage 70 and the resin plate 20A of the "comparative vapor deposition mask preparation body" small, in other words, to improve close contact between the processing stage 70 and the resin plate 20A of the "comparative vapor deposition mask preparation body", various adsorption methods such, for example, as electrostatic adsorption, vacuum adsorption, and a method of adsorption with a magnet can be used. However, these adsorption methods are not preferable because there arises the case where smoothness of the resin plate 20A of the "comparative vapor deposition mask preparation body" deteriorates, adsorption parts are damaged by irradiation with laser light, or partially (microscopically), parts where the resin plate 20A and the processing stage 70 are not brought in complete close contact with each other arise.

Figure 3:
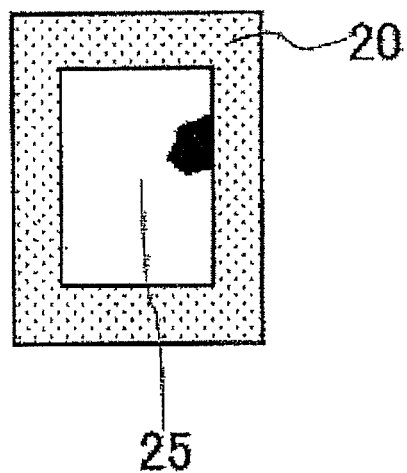
FIGS. 3(a)-(b) show expanded elevation views of the vicinity of a resin mask opening as a vapor deposition mask produced using a comparative vapor deposition mask preparation body is seen from the resin mask side.
Figure 3:
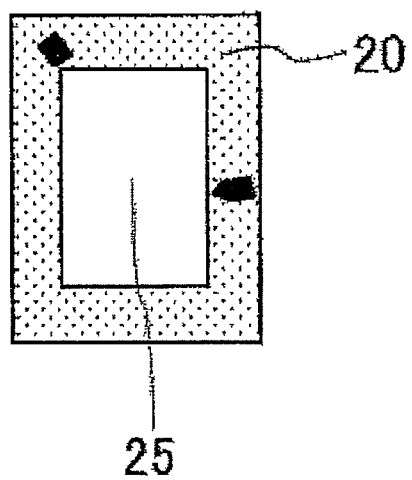

The "burrs" and the "rubble" arising in forming the resin mask openings 25 in the resin plate 20A of the "comparable vapor deposition mask preparation body" tend to protrude toward the inner circumference side of the resin mask openings 25 as shown in FIG. 3(a) and/or, to stick onto the surface of the resin mask 20 on the side that is not in contact with the metal mask 10 as shown in FIG. 3(b). In the case where the "burrs" and the "rubble" as shown in FIG. 3(a) arise, when forming a vapor deposition pattern on a vapor deposition target using the produced vapor deposition mask, the "burrs" and the "rubble" block a vapor deposition material released from a vapor deposition source, which causes an insufficient pattern to be formed on the vapor deposition target, that is, so-called pattern defects to arise. Although in order to perform pattern vapor deposition with excellent precision on the vapor deposition target using the vapor deposition mask, the vapor deposition mask and the vapor deposition target are needed to be in sufficient close contact with each other, when the "burrs" and the "rubble" as shown in FIG. 3(b) arise, poor close contact between the vapor deposition mask and the vapor deposition target arises, which causes pixel blur and the like to arise. Notably, FIGS. 3(a)-(b) are expanded elevation views of the vicinity of the resin mask opening 25 as the vapor deposition mask produced using the "comparative vapor deposition mask preparation body" is seen from the resin mask side in plan view.

<Step of Preparing Vapor Deposition Mask Preparation Body>

Therefore, in the method for producing a vapor deposition mask according to an embodiment of the present disclosure, as the vapor deposition mask preparation body including the resin plate 20A for forming the resin mask openings 25 by irradiation with laser light, the vapor deposition mask preparation body 60 in which the metal mask 10 is provided on one surface of the resin plate 20A and the protective sheet 30 with peel strength not less than about 0.0004 N/10 mm and less than about 0.2 N/10 mm in conformity with JIS Z-0237: 2009 is provided on the other surface of the resin plate 20A is used. In other words, as the vapor deposition mask preparation body 60 for obtaining the vapor deposition mask 100, the vapor deposition mask preparation body 60 that includes the following (Feature 1) and (Feature 2) is used.

(Feature 1): The metal mask 10 is provided on one surface of the resin plate 20A for obtaining the resin mask 20, and the protective sheet 30 is provided on the other surface of the resin plate 20A.

(Feature 2): In the vapor deposition mask preparation body 60 exhibiting the configuration of the aforementioned (Feature 1), the peel strength, in conformity with JIS Z-0237:2009, of the protective sheet provided on the other surface of the resin plate 20A is not less than about 0.0004 N/10 mm and less than about 0.2 N/10 mm.

According to the vapor deposition mask preparation body 60 with these features (in particular, the aforementioned (Feature 1)), when the resin plate 20A of the vapor deposition mask preparation body 60 is irradiated with laser light to decompose the resin plate 20A and to form the resin mask openings 25, "burrs" and "rubble" can be suppressed from arising. Thereby, the vapor deposition mask 100 which can form a vapor deposition pattern with high definition can be obtained. Specifically, the protective sheet 30 provided on the other surface of the resin plate 20A enables out-of-focus blur in the occasion when the resin plate 20A is irradiated with laser light to form the resin mask openings 25 to be suppressed, and "burrs" and "rubble" caused by insufficient decomposition of the resin plate 20A due to out-of-focus blur can be suppressed from arising. Moreover, according to the vapor deposition mask preparation body 60 with these features (in particular, the aforementioned (Feature 1)), for example, even in the case where a gap arises between the processing stage 70 and the vapor deposition mask preparation body 60 when the vapor deposition mask preparation body 60 is placed on the processing stage 70 to form the resin mask openings 25, out-of-focus blur in the occasion when the resin plate 20A is irradiated with laser light to form the resin mask openings 25 can be suppressed.

Moreover, according to the vapor deposition mask preparation body 60 with the aforementioned features (in particular, the aforementioned (Feature 1)), in addition to suppression of out-of-focus blur in the occasion when the resin mask openings 25 are formed in the resin plate 20A, the strength of the resin plate 20A itself can be enhanced, and also thereby, "burrs" and "rubble" can be suppressed from arising. Specifically, with the presence of the protective sheet 30 provided on the other surface of the resin plate 20A, the strength of the recess parts to be the resin mask openings 25 in the final stage and the resin plate 20A near the recess parts can be prevented from deteriorating. Specifically, when it is assumed that the protective sheet 30 is a resin plate, an apparent thickness of the resin plate 20A can be increased. In other words, the protective sheet 30 serves to prevent out-of-focus blur, and in addition, serves as a support body for preventing the strength of the resin plate from deteriorating. Notably, by preventing the strength of the recess parts to be the resin mask openings 25 in the final stage and the resin plate 20A near the recess parts from deteriorating with the protective sheet 30 provided on the other surface of the resin plate 20A, in the stage of forming the resin mask openings in the resin plate 20A by irradiation with laser light, parts of the resin plate 20A can be suppressed from being chipped off or undergoing similar action.

Notably, in the case where the resin mask openings 25 are formed in the resin plate 20A in the state where the vapor deposition mask preparation body is fixed to a frame in order to reduce a positioning error of the frame to the vapor deposition mask, when this vapor deposition mask preparation body is the "comparative vapor deposition mask preparation body" in which the protective sheet 30 is not adsorbed on the other surface of the resin plate 20A, the resin plate 20A of the "comparative vapor deposition mask preparation body" and the processing stage 70 cannot be brought into close contact with each other due to the presence of the frame in the occasion of irradiation with laser light, and when the resin mask openings 25 are formed in the state of being fixed to the frame, an extent of out-of-focus blur is large. On the other hand, in the method for producing a vapor deposition mask according to an embodiment of the present disclosure, even when a gap exists between the vapor deposition mask preparation body 60 and the processing stage 70, due to the presence of the protective sheet 30 adsorbed on the other surface of the resin plate 20A, out-of-focus blur can be prevented from arising in the occasion when the resin mask openings 25 are formed in the resin plate 20A.

In other words, according to the method for producing a vapor deposition mask according to an embodiment of the present disclosure with the aforementioned features (in particular, the aforementioned (Feature 1)), "burrs" and "rubble" can be suppressed from arising in the occasion when the resin mask openings 25 are formed in the resin plate 20A, and the resin mask openings 25 can be formed in the resin plate 20A with excellent precision.

Furthermore, in the method for producing a vapor deposition mask according to an embodiment of the present disclosure, since the vapor deposition mask preparation body 60 with (Feature 2) as well as the aforementioned (Feature 1) is used, in a step of peeling off the protective sheet 30 from the vapor deposition mask preparation body 60 mentioned later, the resin plate 20A can be suppressed from being damaged, and the protective sheet 30 can be suppressed from being unintentionally peeled off before the step of peeling off the protective sheet 30.

In the method for producing a vapor deposition mask according to an embodiment of the present disclosure, as the aforementioned (Feature 2), that the protective sheet 30 with peel strength not less than about 0.0004 N/10 mm and less than about 0.2 N/10 mm in conformity with JIS Z-0237:2009 is provided on the other surface of the resin plate 20A is the essential condition. In other words, that as the protective sheet 30 provided on the other surface of the resin plate 20A, the protective sheet 30 with peel strength not less than about 0.0004 N/10 mm and less than about 0.2 N/10 mm in conformity with JIS Z-0237:2009 is used is the essential condition. A reason is that in the case where a protective sheet with peel strength not less than about 0.2 N/10 mm in conformity with JIS Z-0237:2009 is provided on the other surface of the resin plate 20A, when this protective sheet is peeled off from the resin plate 20A, the resin plate 20A is damaged, in other word, the resin plate 20A suffers high stress, and changes in dimension and position of the resin mask openings 25 formed in the resin plate 20A arise. Moreover, another reason is that peeling traces and the like tend to arise in the resin plate 20A. On the other hand, still another reason is that in the case where a protective sheet with peel strength less than about 0.0004 N/10 mm in conformity with JIS Z-0237:2009 is provided on the other surface of the resin plate 20A, the protective sheet is unintentionally peeled off before the step of peeling off the protective sheet.

In the vapor deposition mask preparation body in a preferable mode, a protective sheet with peel strength not less than about 0.0012 N/10 mm and not more than about 0.012 N/10 mm in conformity with JIS Z-0237:2009 is provided on the other surface of the resin plate 20A. In the vapor deposition mask preparation body 60 in a still preferable mode, a protective sheet with peel strength not less than about 0.002 N/10 mm and not more than about 0.04 N/10 mm in conformity with JIS Z-0237:2009 is provided on the other surface of the resin plate 20A. In the vapor deposition mask preparation body 60 in a particularly preferable mode, the protective sheet 30 with peel strength not less than about 0.002 N/10 mm and not more than about 0.02 N/10 mm in conformity with JIS Z-0237:2009 is provided on the other surface of the resin plate 20A.

While in the above, the case where the resin mask openings 25 are formed in the state where the vapor deposition mask preparation body 60 is placed on the processing stage 70 is exemplarily described, the method for producing a vapor deposition mask according to an embodiment of the present disclosure does not take the placement of the vapor deposition mask preparation body 60 on the processing stage 70 as the essential condition, but the resin mask openings 25 can also be formed by irradiating the resin plate 20A of the vapor deposition mask preparation body with laser light, for example, in the state where the vapor deposition mask preparation body 60 is fixed to a frame without the vapor deposition mask preparation body 60 placed on the processing stage 70, or by another method other than this.

(Example of Method for Producing Vapor Deposition Mask Preparation Body)

As to the vapor deposition mask preparation body 60 used in the method for producing a vapor deposition mask according to an embodiment of the present disclosure, there is no limitation to a method for producing the vapor deposition mask preparation body 60 as long as it satisfies the conditions that the metal mask 10 is provided on one surface of the resin plate 20A and that the protective sheet 30 that satisfies the aforementioned (Feature 2) is provided on the other surface of the resin plate 20A.

For example, the vapor deposition mask preparation body 60 can be obtained by preparing the metal mask 10 in which the metal mask openings 15 are beforehand formed, pasting this metal mask 10 on the one surface of the resin plate 20A by a conventionally known method, for example, using an adhesive agent or the like, and pasting the protective sheet 30 directly on the other surface of the resin plate 20A, or indirectly thereon using an adhesive agent or the like such that the condition of the aforementioned (Feature 2) is satisfied. Notably, after the protective sheet 30 is provided on the other surface of the resin plate 20A, the metal mask 10 may be pasted on the one surface of the resin plate 20A. Moreover, in place of pasting the protective sheet 30 directly on the resin plate 20A or indirectly thereon, a layer to be the protective sheet 30 may be formed on the resin plate 20A using various printing methods or the like.

Moreover, a metal plate for obtaining the metal mask 10 may be prepared to paste this metal plate on the one surface of the resin plate 20A, to form the metal mask openings 15 that penetrate only the metal plate, and then, to provide the protective sheet 30 on the other surface of the resin plate 20A such that the condition of the aforementioned (Feature 2) is satisfied. To paste the resin plate 20A and the protective sheet 30 together may be performed before the resin plate 20A and the metal plate are pasted together, or may by performed in the stage before the metal mask openings 15 are formed and after the resin plate 20A and the metal plate are pasted together. In other words, to paste the resin plate 20A and the protective sheet 30 together may be performed in any stage as long as it is performed before the resin mask openings 25 are formed in the resin plate 20A.

Figure 4:
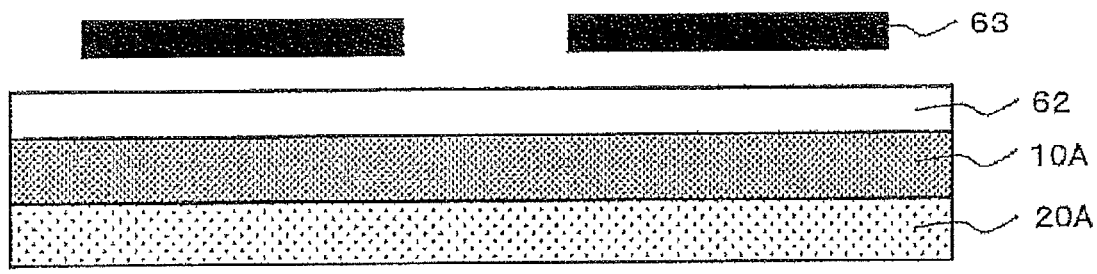
FIGS. 4(a)-(d) show an example of a method of forming the vapor deposition mask preparation body.
Figure 4:
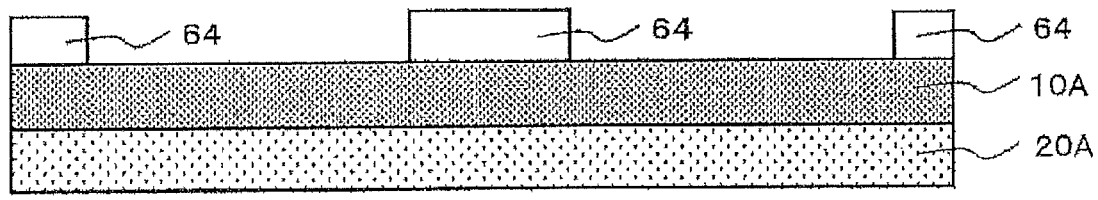
Figure 4:
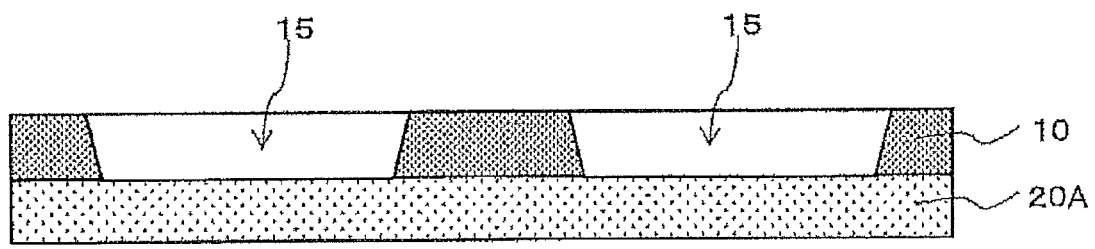
Figure 4:
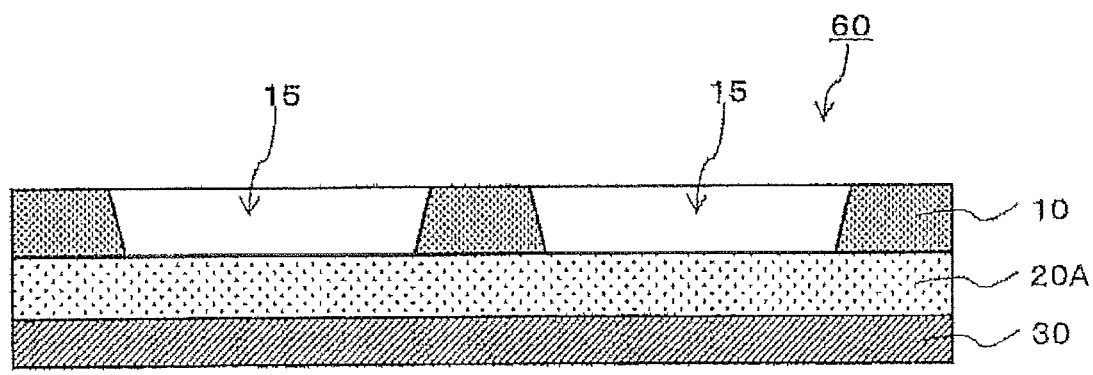

FIGS. 4(*a*) to 4(*d*) are schematic cross-sectional views exemplarily showing a method of forming the vapor deposition mask preparation body 60, and in a mode shown in the figure, after the resin plate 20A is provided on the metal plate 10A, the metal mask openings 15 are formed in the metal plate 10A, and after that, a protective sheet is provided on the surface of the resin plate 20A on the side that is not in contact with the metal mask. Notably, an arbitrary layer may be provided between the resin plate 20A and the protective sheet 30 so as to satisfy the aforementioned (Feature 2).

As a method of forming the resin plate 20A on the metal plate 10A, a method of coating and drying of coating liquid obtained by dispersing or dissolving a resin which is a material of the resin plate 20A in an appropriate solvent by a conventionally known coating method, and the like can be cited. Moreover, the resin plate 20A may be pasted on the metal plate 10A via an adhesive later or the like. In the method, as shown in FIG. 4(*a*), after the resin plate 20A is provided on the metal plate 10A, the surface of the metal plate 10A is coated with a resist material 62, and the resist material is masked using a mask 63 in which a metal mask opening pattern is formed, and is exposed and developed. Thereby, as shown in FIG. 4(*b*), a resist pattern 64 is formed on the surface of the metal plate 10A. Then, using the resist pattern 64 as an etching resistant mask, etching processing is performed only on the metal plate 10A, and the resist pattern is cleaned and removed after the etching. Thereby, as shown in FIG. 4(*c*), a stacked body in which the metal mask 10 configured by forming the metal mask openings 15 in the metal plate 10A is provided on one surface of the resin plate 20A is obtained. Next, as shown in FIG. 4(*d*), the protective sheet 30 is pasted on the other surface of the resin plate 20A of the obtained stacked body, or a layer which is to be the protective sheet 30 is formed thereon using various printing methods, and thereby, the vapor deposition mask preparation body 60 is obtained.

A masking method of the resist material is not specially limited but, as shown in FIG. 4(*a*), only the surface side, of the metal plate 10A, that is not in contact with the resin plate 20A may be coated with the resist material 62, or the individual surfaces of the resin plate 20A and the metal plate 10A may be coated (not shown) with the resist material 62. Moreover, a dry film method of pasting dry film resist on the surface, of the metal plate 10A, that is not in contact with the resin plate 20A, or on the individual surfaces of the resin plate 20A and the metal plate 10A can also be used. A coating method of the resist material 62 is not specially limited but, in the case where only the surface side, of the metal plate 10A, that is not in contact with the resin plate 20A is coated with the resist material 62, a spin coating method or a spray coating method can be used. Meanwhile, when the resin plate 20A and the metal plate 10A are stacked into a long sheet, a dip coating method or the like which can perform coating with a resist material in a roll-to-roll scheme is preferably used. Notably, in the dip coating method, the individual surfaces of the resin plate 20A and the metal plate 10A are to be coated with the resist material 62.

The resist material used is preferably excellent in processablity with desired resolution. Moreover, an etching agent used in the etching processing is not specially limited but a known etching agent only has to be properly selected.

An etching method of the metal plate 10A is not specially limited but, for example, wet etching methods such as a spray etching method of spraying an etching agent from an injection nozzle at predetermined injection pressure, a dip etching method in an etching solution filled with an etching agent, and a spin etching method of dropping an etching agent, and dry etching methods using gas, plasma and the like can be used.

(Protective Sheet)

The protective sheet 30 provided on the other surface of the resin plate 20A only has to be able to satisfy the condition of the aforementioned (Feature 2), and, in other words, there is no limitation to conditions other than this as long as it satisfies the condition that the protective sheet includes peel strength not less than about 0.0004 N/10 mm and less than about 0.2 N/10 mm in conformity with JIS Z-0237:2009.

The protective sheet 30(*i*) may be directly provided on the other surface of the resin plate 20A, or (ii) may be indirectly provided on the other surface of the resin plate 20A via an arbitrary layer, so as to satisfy the condition of the aforementioned (Feature 2).

As the protective sheet 30 directly provided on the other surface of the resin plate 20A, the protective sheet 30 whose surface includes self-adsorption or self-adhesion can be cited.

The self-adsorption of the protective sheet 30 stated here means a property with which, by a mechanism of the protective sheet 30 itself, it can be adsorbed on the other surface of the resin plate 20A, and specifically, means a property with which it can be brought into close contact onto the other surface of the resin plate 20A, not via an adhesive agent, a pressure-sensitive adhesive agent or the like between the other surface of the resin plate 20A and the protective sheet, and without need for an external mechanism such, for example, as attraction with a magnet or the like between the resin plate 20A and the protective sheet. According to such a protective sheet 30 with self-adsorption, in the occasion when it comes into contact with the resin plate 20A, the protective sheet 30 can be adsorbed onto the resin plate 20A while causing air to escape.

As the protective sheet 30 with self-adsorption, for example, the protective sheet 30 on which self-adsorption is expressed due to action of a resin material itself constituting the protective sheet 30 can be used.

Such a resin material of the protective sheet 30 is not specially limited but a material with which peel strength in the occasion when the protective sheet 30 is peeled off from the resin plate 20A can satisfy the condition of the aforementioned (Feature 2) can be properly selected and used. Examples of the protective sheet 30 include, as a resin which can express self-adsorption, an acrylic resin, a silicone-based resin, a urethane-based resin, a polyester resin, an epoxy resin, a polyvinyl alcohol resin, a cycloolefin resin, a polyethylene resin and the like, and therewith, peel strength in the occasion when the protective sheet 30 is peeled off from the resin plate 20A satisfies the condition of the aforementioned (Feature 2). Also for a resin material of the protective sheet including a cell suction cup structure mentioned later, these resin materials can be used. Notably, the protective sheet 30 may solely contain one type of resin, or may contain two or more types of resins. For example, peel strength of the protective sheet 30 can also be adjusted so as to satisfy the condition of the aforementioned (Feature 2) using a combination of resin materials with high peelability. The same holds true for the protective sheets 30 in various modes mentioned later. Moreover, as the protective sheet 30 in which the resin material itself includes adsorption, for example, a sheet-like object and the like in which a material itself includes adsorption, which is disclosed in Japanese Patent Laid-Open No. 2008-36895, can also be used.

Moreover, in place of the aforementioned protective sheet 30 with self-adsorption due to action of the resin material itself, the protective sheet 30 whose surface includes a cell suction cup structure may be used. Also in the case of using the protective sheet 30 including the cell suction cup structure, that peel strength in the occasion when the protective sheet 30 is peeled off from the resin plate 20A satisfies the condition of the aforementioned (Feature 2) is the condition. The cell suction cup structure means a continuous fine roughness structure formed on the surface, and self-adsorption is given the protective sheet 30 by this continuous fine roughness structure acting as suction cups. As such a protective sheet 30, for example, a sheet-like object and the like including the cell suction cup structure can be cited, which is disclosed in Japanese Patent Laid-Open No. 2008-36895.

By performing adhesion processing on the surface of the protective sheet 30 on the side that is contact with the resin plate 20A, pressure-sensitive adhesion (sometimes also referred to as adhesion) can also be expressed on the protective sheet 30. As the adhesion processing, for example, corona discharge processing, firing processing, ozone processing, ultraviolet light processing, radiation processing, roughness processing, chemical processing, plasma processing, low temperature plasma processing, primer processing, grafting processing and the like can be cited.

In place of the protective sheet 30 directly provided on the other surface of the resin plate 20A, the protective sheet 30 may be indirectly provided on the other surface of the resin plate 20A via a layer including adhesion or pressure-sensitive adhesion (hereinafter sometimes referred to as intermediate layer). Notably, also in modes in which the protective sheet 30 is indirectly provided, that peel strength in the occasion when the protective sheet 30 is peeled off from the resin plate 20A takes satisfaction of the aforementioned (Feature 2) as the essential condition.

When the protective sheet 30 itself does not include self-adsorption or self-adhesion, the intermediate layer serves to bring the resin plate 20A and the protective sheet 30 into close contact with each other. In other words, as the intermediate layer, a layer including adhesion or pressure-sensitive adhesion is used. Moreover, in the case where the protective sheet 30 is directly provided on the other surface of the resin plate 20A, when the condition of the aforementioned (Feature 2) cannot be satisfied, the intermediate layer can also be provided between the resin plate 20A and the protective sheet 30, as a layer for adjusting peel strength in the occasion when the protective sheet 30 is peeled off from the resin plate 20A. Notably, as to the intermediate layer for adjusting peel strength, for example, in the case where peel strength in the occasion when the protective sheet 30 is peeled off is not less than about 0.2 N/10 mm when the protective sheet 30 is directly provided on the other surface of the resin plate 20A, it may be provided, as a layer for lowering this peel strength, between the resin plate 20A and the protective sheet 30, and in the case where peel strength in the occasion when the protective sheet 30 is peeled off is less than about 0.0004 N/10 mm, it may be provided, as a layer for increasing this peel strength, between the resin plate 20A and the protective sheet 30.

The intermediate layer may exhibit a single layer configuration constituted of one layer, or may exhibit a stacking configuration having two or more layers stacked. For example, an intermediate layer obtained by stacking an adhesive layer for bringing the resin plate 20A and the protective sheet 30 into close contact with each other, and a peel-off layer for adjusting peel strength in the occasion when the protective sheet is peeled off in this order from the resin plate 20A side may be provided between the resin plate 20A and the protective sheet 30.

The intermediate layer may be a layer which is peeled off from the resin plate 20A along with the protective sheet 30 when the protective sheet 30 is peeled off from the resin plate 20A, or may be a layer which remains on the resin plate 20A side. Notably, in the step of forming the resin mask openings 25 by irradiating the resin plate 20A with laser light, when the protective sheet 30 and the intermediate layer are decomposed with the laser light, since these can become new generation sources of "burrs" and "rubble", the protective sheet 30 and the intermediate layer are preferably not decomposed or hardly decomposed with laser light as mentioned later. Notably, when an intermediate layer that is not decomposed or hardly decomposed with laser light is set, and a configuration in which the intermediate layer remains on the resin plate 20A side in the step of peeling off the protective sheet 30 from the resin plate 20A is set, the remaining intermediate layer is to close the resin mask openings 25 formed in the resin plate 20A, which is not preferable. With this point taken into consideration, the material of the intermediate layer is preferably not decomposed or hardly decomposed with laser light, can preferably satisfy the condition of the aforementioned (Feature 2) of peel strength in the occasion when the protective sheet 30 is peeled off from the resin plate 20A, and can preferably make its close contact with the protective sheet 30 higher than its close contact with the resin plate 20A. According to such a mode, the protective sheet 30 can be peeled off from the resin plate 20A along with the intermediate layer.

As the protective sheet 30 indirectly provided on the other surface of the resin plate 20A, for example, various plastic films or sheets of polyester such as poly(ethylene telephthalate), polyarylate, polycarbonate, polyurethane, polyimide, polyether imide, cellulose derivatives, polyethylene, ethylene-vinyl acetate copolymers, polypropylene, polystyrene, acrylics, polyvinyl chloride, polyvinylidene chloride, polyvinyl alcohol, polyvinyl butyral, nylon, polyetheretherketone, polysulfone, polyethersulfon, tetrafluoroethylene-perfluoroalkyl vinyl ether, polyvinylfluoride, tetrafluoroethylene-ethylene, tetrafluoroethylene-hexafluoropropylene, polychlorofluoroethylene, polyvinylidene fluoride and the like can be cited.

As the material of the intermediate layer, for example, an acrylic resin, a vinyl chloride-based resin, a vinyl acetate-based resin, a vinyl chloride/vinyl acetate copolymer resin, a polyester-based resin, a polyamide-based resin and the like can be cited.

The thickness of the intermediate layer is not specially limited but is preferably within a range not less than about 1 μm and not more than about 50 μm, still preferably within a range not less than about 3 μm and not more than about 20 μm.

A method of forming the intermediate layer is not specially limited but, for example, it can be formed by coating and drying, on the other surface of the resin plate 20A, of a coating liquid for an intermediate layer which liquid is obtained by dissolving or dispersing, in an appropriate solvent, one or two or more resin materials with which peel strength in the occasion when the protective sheet 30 is peeled off from the resin plate 20A can satisfy the aforementioned (Feature 2), and in addition, an additive which is added as needed. Moreover, in place of the method of forming the intermediate layer by coating, pasting of a pressure-sensitive adhesive sheet or the like with which peel strength in the occasion when the protective sheet 30 is peeled off from the resin plate 20A can satisfy the aforementioned (Feature 2) can also form the intermediate layer.

The protective sheet 30 provided on the intermediate layer may be formed by pasting, on the intermediate layer, a protective sheet or a protective film with which peel strength in the occasion when the protective sheet 30 is peeled off from the resin plate 20A can satisfy the aforementioned (Feature 2), or may be formed by coating and drying, on the other surface of the resin plate 20A, of coating liquid obtained by dissolving or dispersing, in an appropriate solvent, one or two or more resin materials with which peel strength in the occasion when the protective sheet 30 is peeled off from the resin plate 20A can satisfy the aforementioned (Feature 2), and in addition, an additive which is added as needed.

The protective sheet 30 in preferable modes includes about 70% or more of transmittance at a wavelength of laser light for forming the resin mask openings 25 in the resin plate 20A, preferably about 80% or more thereof, regardless of the protective sheet 30 directly provided on the resin plate 20A or indirectly provided thereon via an intermediate layer or the like. Moreover, when the protective sheet 30 is indirectly provided on the resin plate 20A via the intermediate layer, the intermediate layer as well as the protective sheet 30 preferably includes about 70% or more of transmittance at a wavelength of laser light for forming the resin mask openings 25 in the resin plate 20A, particularly about 80% or more thereof. According to the protective sheet 30 in preferable modes, in the occasion of irradiation with laser light to form the resin mask openings 25 in the resin plate 20A, the intermediate layer and the protective sheet 30 can be suppressed from being decomposed with this laser light. Thereby, various problems caused by decomposition of the intermediate layer and the protective sheet 30, for example, that "rubble" arising due to decomposition of the intermediate layer and the protective sheet 30 causes sticking or similar action onto the inner wall surfaces of the resin mask openings 25 formed in the resin plate 20A, can be suppressed. Notably, the wavelength of laser light is different depending on types of laser light used, and, for example, when a polyimide resin is used as the material of the resin plate 20A, YAG laser, excimer laser or the like is used. Notably, for fine processing, YAG laser (third harmonic generation) with 355 nm of wavelength of laser light, and excimer laser (KrF) with 248 nm of wavelength of laser light are suitable. Accordingly, when the protective sheet 30 is selected, the material of the protective sheet 30 only has to be properly selected such that the transmittance of laser light is the aforementioned preferable transmittance in accordance with a type of laser used. Moreover, as a method of setting the transmittance of the protective sheet 30 that can satisfy the condition of the aforementioned (Feature 2) to the aforementioned preferable transmittance, measures of adjusting the thickness of the protective sheet 30, specifically, a method of making the thickness of the protective sheet 30 thin, and a method of using a resin material or the like high in transparency as the resin material of the protective sheet 30, can be cited.

The thickness of the protective sheet 30 is not specially limited but preferably not less than about 1 μm and not more than about 100 μm, still preferably not less than about 2 μm and not more than about 75 μm, further preferably not less than about 2 μm and not more than about 50 μm, particularly preferably within a range not less than about 3 μm and not more than about 30 μm. By setting the thickness of the protective sheet 30 to be not less than about 1 μm, strength of the protective sheet 30 can be sufficiently enhanced, and when the resin mask openings are formed by irradiating the resin plate 20A with laser light, risks or the like that the protective sheet 30 breaks or that the protective sheet 30 suffers cracks can be reduced. In particular, when the thickness of the protective sheet 30 is set to be not less than about 3 μm, these risks can be further reduced.

Moreover, as the protective sheet 30, a support member-integrated protective sheet (not shown) in which the protective sheet 30 is supported on a support member can also be used. With the support member-integrated protective sheet, even when the thickness of the protective sheet 30 itself is made thin, handling ability and the like of the protective sheet 30 can be made excellent. The thickness of the support member is not specially limited but can be properly set in accordance with the thickness of the protective sheet 30, preferably not less than about 3 μm and not more than about 200 μm, still preferably not less than about 3 μm and not more than about 150 μm, further preferably not less than about 3 μm and not more than about 100 μm, particularly preferably not less than about 10 μm and not more than about 75 μm.

The material of the support member is not specially limited but a resin material, a glass material and the like can be used, and the resin material is preferably used in view of flexibility and the like.

Figure 5:
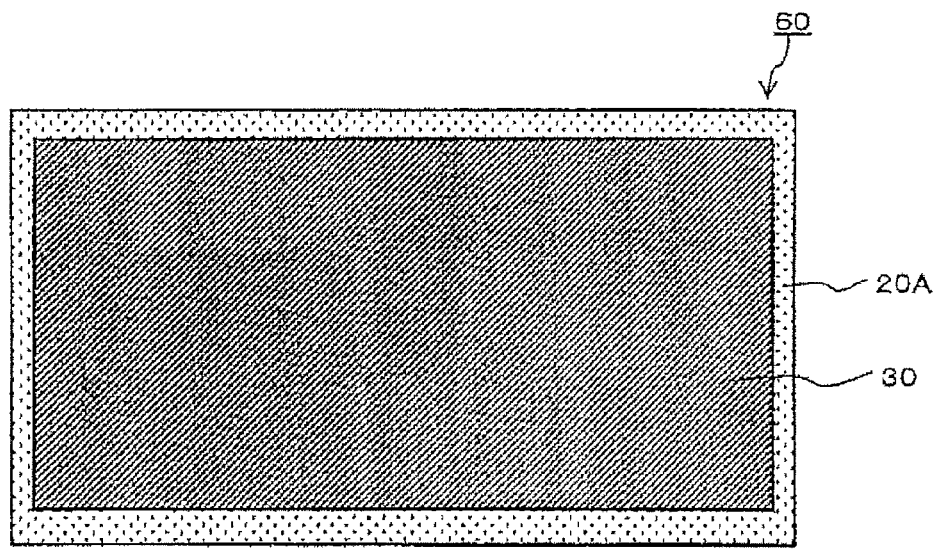
FIG. 5(a) is an elevation view of an exemplary vapor deposition mask preparation body as seen from the protective sheet 30 side in plan view.
FIG. 5(b) is a schematic cross-sectional view of the vapor deposition mask preparation body in FIG. 5(a).
Figure 5:
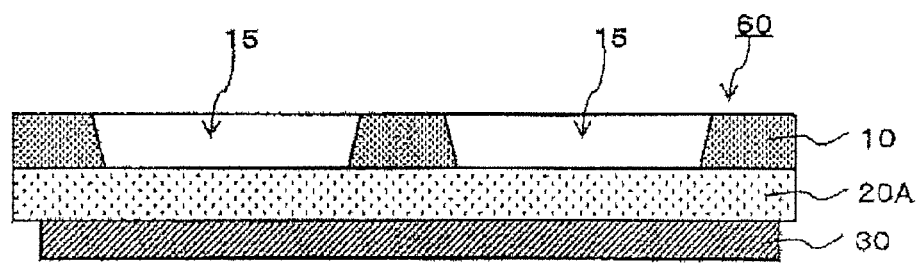

The protective sheet 30 is provided on the other surface of the resin plate 20A and at a position overlapping with the resin mask openings 25 formed in the resin plate 20A in the final stage in the thicknesswise direction. On the other surface of the resin plate 20A, one protective sheet 30 may be provided, or a plurality of protective sheets 30 may be provided. In a mode shown in FIGS. 5(a) and 5(b), one protective sheet 30 is provided on the other surface of the resin plate 20A. Notably, FIG. 5(a) is an elevation view of an exemplary vapor deposition mask preparation body 60 as seen from the protective sheet 30 side, and FIG. 5(b) is a schematic cross-sectional view thereof. While in the mode shown in FIGS. 5(a)-(b), the length of the protective sheet 30 in the crosswise direction (horizontal direction in the figure) is made shorter than the length of the resin plate 20A in the crosswise direction, the length of the protective sheet 30 in the crosswise direction may be set to be the same length as the length of the resin plate 20A in the crosswise direction, and the end face of the protective sheet 30 may coincide with the end face of the resin plate 20A in planar position, or the length of the protective sheet 30 in the crosswise direction may be set to be longer than the length of the resin plate 20A in the crosswise direction, and the outer circumference of the protective sheet 30 may be caused to protrude from the resin plate 20A. The same holds true for the length of the protective sheet 30 in the lengthwise direction. Moreover, the same holds true for protective sheets 30 in various modes mentioned later.

As shown in FIGS. 6(a) and 6(b), as to the protective sheet 30 in a preferable mode, a plurality of protective sheets 30 are provided on the other surface of the resin plate 20A. According to this mode, even when upsizing the resin plate 20A, in other words, even when upsizing the vapor deposition mask 100 produced in the final stage, the protective sheets 30 can be simply provided on the other surface of the resin plate 20A. In particular, when the protective sheet 30 is a protective sheet 30 with self-adsorption, as the dimension of the protective sheet 30 becomes larger, a risk that air remains between the resin plate 20A and the protective sheet 30 becomes larger, but by dividing the protective sheet 30 into a plurality of pieces to make the dimension thereof smaller, the risk that air or the like remains between the other surface of the resin plate 20A and each protective sheet 30 can be reduced, which can simply enhance close contact between the resin plate 20A and the protective sheet 30. Moreover, even when, due to a human error or the like in the occasion when the protective sheet 30 is pasted on the resin plate 20A, there arises a need to peel off the protective sheet 30 having been provided on the other surface of the resin plate 20A before the step of forming the resin mask openings 25 in the resin plate 20A, only the protective sheet 30 of interest is needed to be peeled off, which is preferable also in view of work efficiency.

The dimension or the like of the protective sheet 30 in the case where a plurality of protective sheets 30 are provided on the other surface of the resin plate 20A is not specially limited but, for example, it may be a dimension with which one or a plurality of resin mask openings 25 of resin mask openings formed in the final stage can be covered, or may be a dimension with which "one screen" mentioned later or a plurality of screens can be covered. As to the protective sheet 30 in a preferable mode, each of the plurality of protective sheets 30 includes a dimension with which it overlaps with the "one screen" or the plurality of screens formed in the resin plate 20A in the final stage. In particular, since as to a vapor deposition mask in a preferable mode mentioned later, an interval between the screens is wider than an interval between the resin mask openings 25, in view of workability, the protective sheet 30 preferably includes a dimension with which it covers the "one screen" or the plurality of screens, and is preferably provided at a position overlapping with the "one screen" or the plurality of screens in the thicknesswise direction. Notably, in FIGS. 6(a)-(b), each region enclosed by a dotted line is an arrangement scheduled region of the "one screen".

Figure 6:
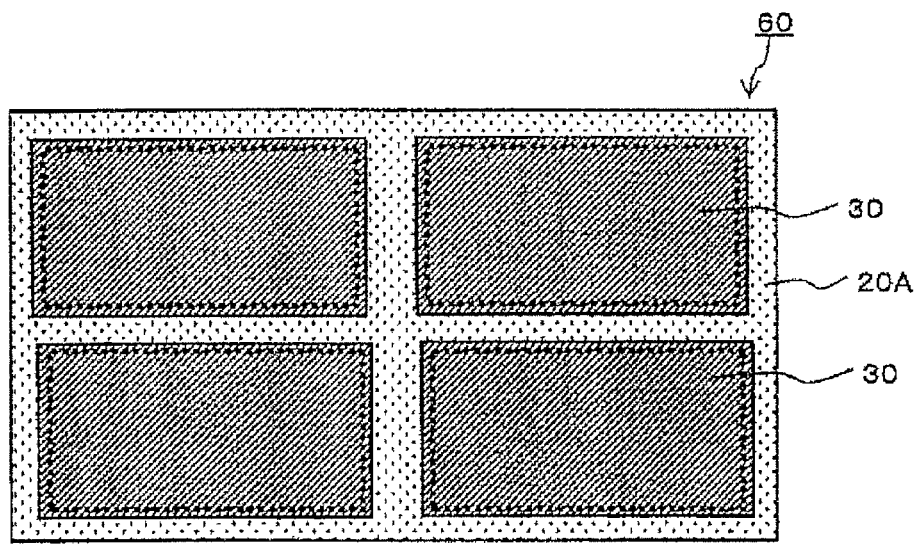
FIG. 6(a) is an elevation view of an exemplary vapor deposition mask preparation body as seen from the protective sheet 30 side in plan view.
FIG. 6(b) is a schematic cross-sectional view of the vapor deposition mask preparation body in FIG. 6(a).
Figure 6:
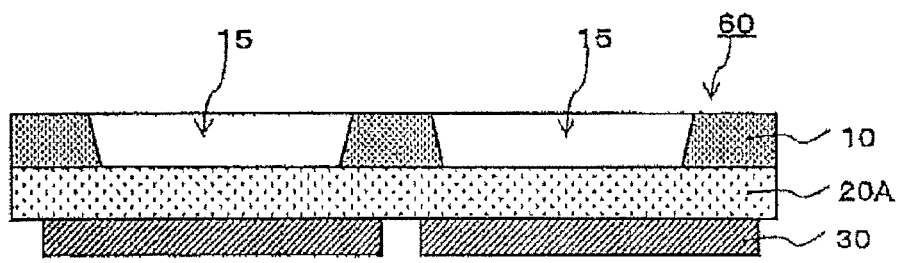
Figure 7:
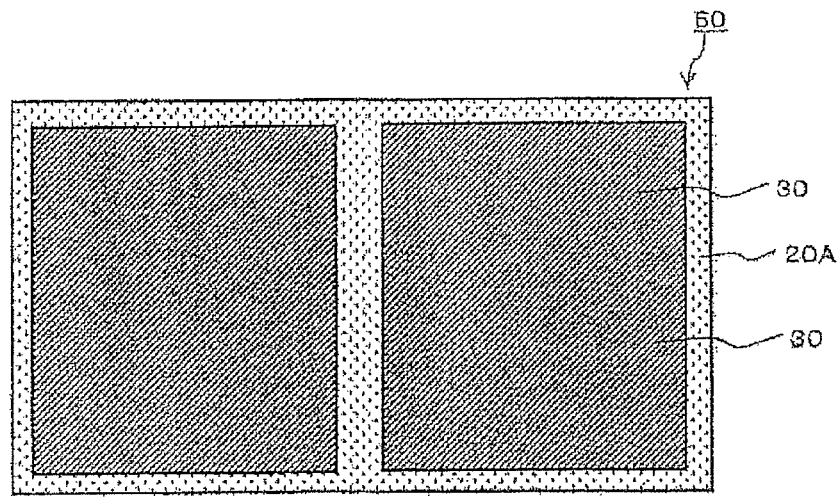
FIGS. 7(a) to 7(c) are elevation views of exemplary vapor deposition mask preparation bodies as seen from the protective sheet 30 side in plan view.
Figure 7B:
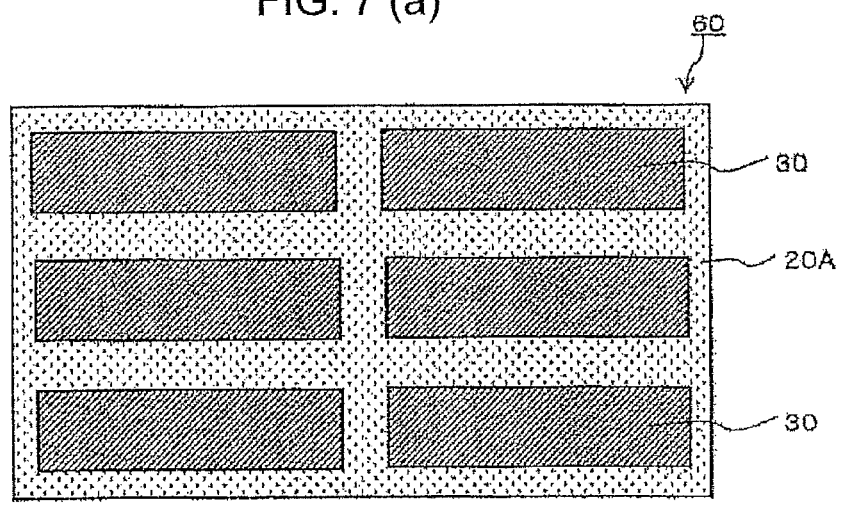
Figure 7C:
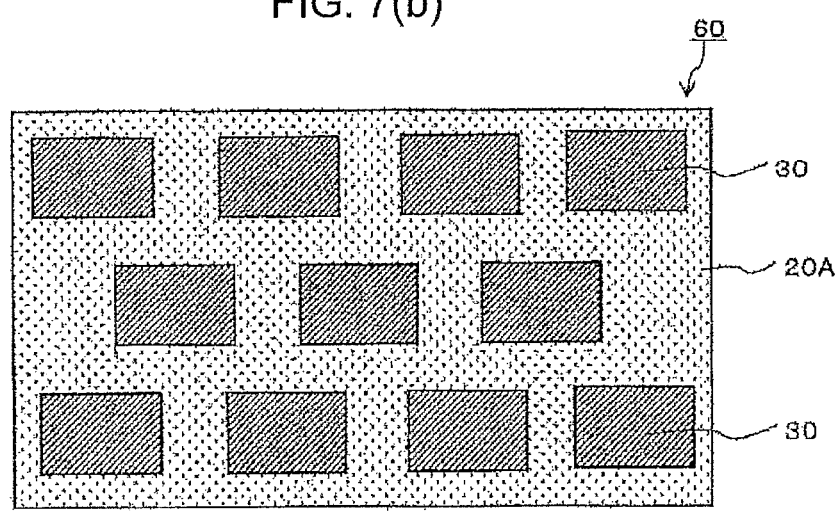

While in the mode shown in FIGS. 6(a)-(b), the plurality of protective sheets 30 are regularly provided in the lengthwise direction and the crosswise direction of the vapor deposition mask preparation body (the vertical direction and the horizontal direction in the figure) as the vapor deposition mask preparation body 60 is seen from the protective sheet 30 side in plan view, as shown in FIG. 7(a), a plurality of protective sheets 30 extending in the lengthwise direction may be provided in the crosswise direction, or as shown in FIG. 7(b), a plurality of protective sheets 30 extending in the crosswise direction may be provided in the lengthwise direction. Moreover, as shown in FIG. 7(c), a plurality of protective sheets 30 may be alternately provided at random.

<Step of Forming Resin Mask Opening>

As shown in FIG. 1(b), this step is a step of irradiating, with respect to the vapor deposition mask preparation body 60 prepared above, the resin plate 20A with laser light through the metal mask openings 15 from the metal mask 10 side to form the resin mask openings 25 corresponding to a pattern to be produced by vapor deposition in the resin plate 20A. Notably, while in the mode shown in the figure, irradiation with laser light is performed with respect to the vapor deposition mask preparation body 60 placed on the processing stage 70, the processing stage 70 is an arbitrary configuration in the method for producing a vapor deposition mask according to an embodiment of the present disclosure, and the resin mask openings 25 may be formed without the vapor deposition mask preparation body 60 placed on the processing stage 70.

A laser apparatus used in this step is not specially limited but a conventionally known laser apparatus is sufficient to be used. Moreover, the pattern to be produced by vapor deposition in the specification of the present application means a pattern to be produced using the vapor deposition mask, and, for example, when the vapor deposition mask is used for forming an organic layer of an organic EL element, it is the shape of the organic layer.

<Step of Fixing Vapor Deposition Mask Preparation Body to Frame>

The method for producing a vapor deposition mask according to an embodiment of the present disclosure may include a step of fixing the vapor deposition mask preparation body 60 to a frame, between arbitrary steps before forming the resin mask openings 25, or after these steps. While this step is an arbitrary step in the method for producing a vapor deposition mask of an embodiment of the present invention, by beforehand fixing the vapor deposition mask preparation body 60 to a frame in the stage before irradiation with laser light to form the resin mask openings 25 in the resin plate 20A, an attachment error arising in fixing the obtained vapor deposition mask 100 to a frame can be made zero. Notably, in place of fixing the vapor deposition mask preparation body 60 to a frame, after fixing, to a frame, a stacked body in which the metal mask 10 is provided on one surface of the resin plate 20A, or a stacked body in which the metal plate 10A for obtaining the metal mask is provided on one surface of the resin plate 20A, the protective sheet 30 may be provided on the other surface of the resin plate 20A in the stacked body.

Fixation of the vapor deposition mask preparation body to a frame may be performed on the surface of the frame or may be performed on the lateral face of the frame.

Notably, while when laser processing is performed in the state where the vapor deposition mask preparation body 60 is fixed to a frame, depending on the fixing mode of the vapor deposition mask preparation body 60 to the frame, a gap arises between the vapor deposition mask preparation body 60 and the processing stage 70, or a gap microscopically arises due to insufficient close contact between the vapor deposition mask preparation body 60 and the processing stage 70, since in the vapor deposition mask preparation body 60, the protective sheet 30 is provided on the other surface of the resin plate 20A, the presence of the protective sheet 30 enables deterioration in strength of the resin plate 20A and out-of-focus blur that can arise due to the gap between the resin plate 20A and the processing stage 70 to be prevented. Accordingly, the method for producing a vapor deposition mask according to an embodiment of the present disclosure is particularly preferable in the case where the resin mask openings 25 are formed in the state where the vapor deposition mask preparation body 60 is fixed to a frame.

Figure 8:
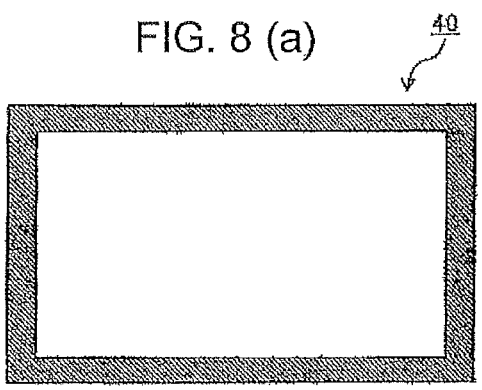
FIGS. 8(a)-(d) elevation views exemplarily showing frames.
Figure 8:
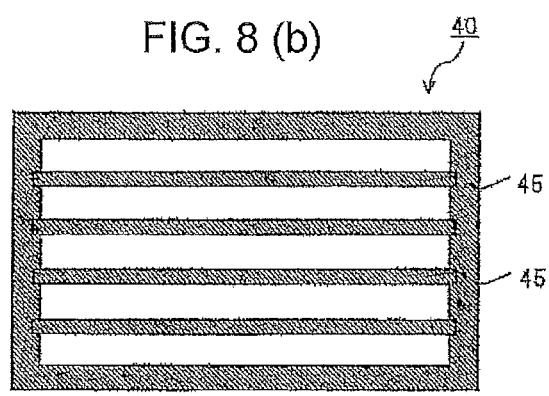
Figure 8:
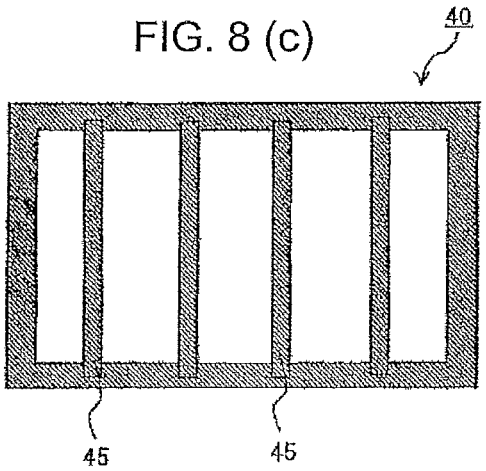
Figure 8:
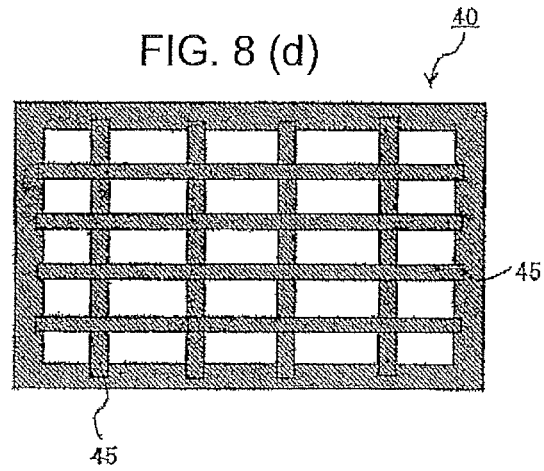

As shown in FIG. 8(a), the frame 40 is a substantially rectangular frame member and includes a through hole for exposing the resin mask openings 25 provided in the resin mask 20 of the vapor deposition mask 100 obtained in the final stage to the vapor deposition source side. The material of the frame is not specially limited but a metal material large in rigidity such, for example, as SUS, an invar material or a ceramic material can be used. Above all, a metal frame is preferable in view of its easy welding to the metal mask of the vapor deposition mask and small influence of deformation and the like.

The thickness of the frame is not specially limited but is preferably within a range not less than about 10 mm and not more than about 30 mm in view of rigidity and the like. The width between the inner circumferential end face of the opening of the frame and the outer circumferential end face of the frame is not specially limited as long as it is a width with which the metal mask of the vapor deposition mask can be fixed to the frame, for example, a width within a range not less than about 10 mm and not more than about 70 mm can be exemplarily cited.

Moreover, as shown in FIGS. 8(b) to 8(d), as the frame 40, the frame 40 in which reinforcement frames 45 and the like are provided in the region of the through hole may be used so as not to disturb exposure of the resin mask openings 25 formed in the resin plate 20A. In other words, a configuration in which the opening included in the frame 40 is divided by the reinforcement frames and the like may be included. To provide the reinforcement frames 45 also enables the frame 40 and the vapor deposition mask preparation body 60 to be fixed to each other using the reinforcement frames 45. Specifically, when a plurality of vapor deposition mask preparation bodies 60 described above are arranged and fixed in the lengthwise direction and the crosswise direction, the vapor deposition mask preparation body 60 can be fixed to the frame 40 also at positions where the reinforcement frames and the vapor deposition mask preparation bodies 60 overlap with each other.

A method for fixing the frame 40 and the vapor deposition mask preparation body 60 to each other is not specially limited but the fixation can be performed using spot welding of fixation with laser light or the like, an adhesive agent, screw fastening, or another method other than these.

<Step of Peeling Off Protective Sheet>

As shown in FIG. 1(c), this step is a step of peeling off and removing the protective sheet 30 from the resin mask 20 after the resin mask openings 25 are formed in the resin plate 20A of the vapor deposition mask preparation body 60 to obtain the resin mask 20. In other words, it is a step of peeling off and removing the protective sheet 30 from the vapor deposition mask. Via this step, the vapor deposition mask 100 including the metal mask 10 in which the metal mask openings are formed and the resin mask 20 in which the resin mask openings 25 corresponding to a pattern to be produced by vapor deposition are formed at positions overlapping with the metal mask openings 15, the metal mask and the resin mask being stacked, is obtained.

As described above, since in the method for producing a vapor deposition mask according to an embodiment of the present disclosure, the protective sheet 30 with peel strength not less than about 0.0004 N/10 mm and less than about 0.2 N/10 mm in conformity with JIS Z-0237:2009 is provided on the other surface of the resin plate 20A, the protective sheet 30 can be peeled off simply from the resin mask 20 in which the resin mask openings 25 are formed only by lifting the protective sheet 30 without other separate processing such, for example, as dissolving processing or UV processing for removing the protective sheet. Moreover, by setting the upper limit value of the peel strength to be less than about 0.2 N/10 mm, stress on the resin plate 20A can be suppressed from being exerted when peeling off the protective sheet 30.

Notably, when the protective sheet with peel strength not less than about 0.2 N/10 mm in conformity with JIS Z-0237: 2009 is provided on the other surface of the resin plate 20A, stress exerted on the resin plate 20A is too high, which causes dimension displacement and positional displacement to tend to arise in the resin mask openings 25 formed in the resin plate 20A in the step of forming the resin mask openings. Moreover, peeling traces and the like tend to arise on the other surface of the resin plate 20A.

Moreover, even when in the step of forming the resin mask openings 25, "rubble" of the resin plate 20A sticks to the surface and the like of the protective sheet 30 due to decomposition of the resin plate 20A, this "rubble" can be peeled off and removed in this step along with the protective sheet 30. Moreover, in the case where the protective sheet 30 with self-adsorption is used as the protective sheet 30, the surface of the resin plate 20A (resin mask 20) in which the resin mask openings 25 are formed is not contaminated with the material of the protective sheet 30 and the like when the protective sheet 30 is peeled off from the resin plate 20A, and cleaning processing or the like is not needed.

According to the method for producing a vapor deposition mask according to an embodiment of the present disclosure described above, the presence of the protective sheet 30 enables a vapor deposition mask including the resin mask 20 including the resin mask openings 25 with high definition and the metal mask, the resin mask and the metal mask being stacked, to be produced in an excellent yield.

Next, predominance of the method for producing a vapor deposition mask according to an embodiment of the present disclosure, the method including: forming resin mask openings in the resin plate 20A with respect to the vapor deposition mask preparation body in which a protective sheet with peel strength not less than about 0.0004 N/10 mm and less than about 0.2 N/10 mm in conformity with JIS Z-0237:2009 is provided on the other surface of the resin plate 20A of the vapor deposition mask preparation body 60; and, after that, peeling off the protective sheet from a resin mask in which the resin mask opening have been formed, is described.

Each support member-integrated protective sheet presented in Table 1 below (samples 1 to 7) was pasted on the other surface of a resin plate of a vapor deposition mask preparation body such that the resin plate and the protective sheet opposed each other, the resin mask openings 25 were formed by irradiation with laser light from the metal mask side, and laser durability of the protective sheet and the presence or absence of burrs and rubble, in this stage, were examined. Moreover, after the laser processing, peelability in the occasion when the protective sheet was peeled off from the resin plate (resin mask in which the resin mask openings were formed) was also examined. Notably, for sample A, the resin mask openings were formed in the resin plate without providing a protective sheet. Moreover, for samples 6 and 7, only evaluation of peelability was performed.

In each vapor deposition mask preparation body used, a metal mask (invar material, 40 μm of thickness) in which metal mask openings were formed was provided on one surface of a resin plate (polyimide resin, 5 μm of thickness), and each support member-integrated protective sheet presented in Table 1 below was provided on the other surface of the resin plate. For laser processing, YAG laser with 355 nm of wavelength was used. Table 1 below presents thicknesses of a support member and a protective sheet constituting each support member-integrated protective sheet, and the transmittance of each protective sheet at 355 nm of wavelength. Measurement of peel strength was in conformity with JIS Z-0237:2009, and was performed by using a test plate obtained by pasting a test tape (polyimide film (polyimide tape 5413, 3M Japan Limited) having a pressure-sensitive adhesive agent on its surface) on a stainless steel plate such that the stainless steel plate and the pressure-sensitive adhesive agent opposed each other, pasting each protective sheet as a test piece (samples 1 to 7) on this polyimide film of the test plate, and measuring peel strength (relative to polyimide) in the occasion when the protective sheet as the test piece was peeled off at 180° from the polyimide film as the test plate with an electromechanical universal testing instrument (5900 series, Instron Japan Company Limited). Table 1 presents the evaluation results.

Moreover, in order to show relation between the thickness of the protective sheet provided on the other surface of the resin plate 20A and damage that the protective sheet suffered in the laser processing, sample B was set by forming a layer with 1 μm of thickness and 1% of transmittance at 355 nm of wavelength (layer not including self-adsorption) on the other surface of the resin plate 20A by coating. Moreover, sample C was set by forming a layer with 0.5 μm of thickness and 1% of transmittance at 355 nm of wavelength (layer not including self-adsorption) on the other surface of the resin plate 20A by coating. For these samples B and C, evaluation of the presence or absence of burrs and rubble, and durability of the coating layer in the laser processing were performed. Notably, as the material of the coating layer, a polyimide resin (PHOTONEECE DL-1602, Toray Industries Inc.) was used.

Report of Tests
a) Name of the Standard: JIS Z-0237:2009
b) Test Method: Method 2, the tape was a polyimide tape 5413 (3M Japan Limited)
c) Identification of Samples: Product Numbers (Product Names) presented in the table
d) Test Date and Test Site: Sep. 3 and Dec. 7, 2015, Kashiwa City, Chiba Prefecture
e) Test Results: Interface Breakage
Miscellaneous) Measurement Apparatus: Electromechanical Universal Testing Instrument (5900 series, Instron Japan Company Limited)

As apparent from the results in Table 1 below, according to samples 1 to 5 for which the resin mask openings were formed in the resin plate 20A with respect to the vapor deposition mask preparation body in which the protective sheet 30 was provided on the other surface of the resin plate 20A, as compared with sample A for which the resin mask openings were formed in the resin plate 20A without providing the protective sheet 30 on the other surface of the resin plate 20A, burrs and rubble could be suppressed from arising, and the resin mask openings with high definition could be formed. Moreover, as compared with sample 7 for which a protective sheet with peel strength being about 0.2 N/10 mm in conformity with JIS Z-0237:2009 was provided on the other surface of the resin plate 20A, according to 1 to 6 for which a protective sheet with peel strength not less than about 0.0004 N/10 mm and less than about 0.2 N/10 mm in conformity with JIS Z-0237:2009 was provided on the other surface of the resin plate 20A, damage which the resin mask suffered could be suppressed. Moreover, for sample B for which a coating layer with 1 μm of thickness was provided in place of the protective sheet with self-adsorption, cracks arose in the coating layer in laser processing, and for sample C for which a coating layer with 0.5 μm of thickness was provided, the coating layer broke in laser processing. Moreover, for samples B and C for which the transmittance was set to be less than about 70%, the coating layer was processed with laser light by the coating layer absorbing the laser light, which caused burrs and rubble due to this to slightly arise.

TABLE 1

| | Protective Sheet | | | | | |
|---|---|---|---|---|---|---|
| | Resin Material | | Thickness (μm) | Transmittance (355 nm)(%) | Peel Force (Relative to Polyimide) N/10 mm | Support Member |
| Sample 1 | Urethane-Based | UA-3004ASL Sumiron Co. Ltd. | 7 | 83 | 0.008 | PET 38 μm |
| Sample 2 | Urethane-Based | MASTACK ZUPF-5001 Fujimori Kogyo Co. Ltd. | 10 | 83 | 0.016 | PET 50 μm |

TABLE 1-continued

| | | | | | | |
|---|---|---|---|---|---|---|
| Sample 3 | Acrylic | EC-9000ASL Sumiron Co. Ltd. | 7 | 82 | 0.024 | PET 38 μm |
| Sample 4 | Silicone-Based | FIXFILM STD1 Fujicopian Co. Ltd. | 25 | 79 | 0.004 | PET 25 μm |
| Sample 5 | Acrylic | MASTACK PC-542PA Fujimori Kogyo Co. Ltd. | 4 | 82 | 0.04 | PET 50 μm |
| Sample 6 | Acrylic | EC-625 Sumiron Co. Ltd. | — | — | 0.1 | Polyethylene 55 μm (including Thickness of Protective Sheet) |
| Sample 7 | Acrylic | PP40-R-KG2 Nichiei Kakoh Co. Ltd. | — | — | 0.2 | Polypropylene 40 μm |
| Sample A | | | Without Protective Sheet | | | |
| Sample B | Coating Layer without Self-Adsorption | | 1 | 1 | — | — |
| Sample C | Coating Layer without Self-Adsorption | | 0.5 | 1 | — | — |

| | Adsorption/Air Escape Ability | Laser Durability (Presence or Absence of Deformation of Protective Sheet) | Presence or Absence of Burrs and Rubble | Peelability |
|---|---|---|---|---|
| Sample 1 | OK/Remaining Air (Little) | No Breakage Cracks | None | Excellent |
| Sample 2 | OK/Remaining Air (Little) | No Breakage Cracks | None | Excellent |
| Sample 3 | OK/Remaining Air (Medium) | No Breakage Cracks | None | Damage on Resin Mask (Little) |
| Sample 4 | OK/Remaining Air (None) | No Breakage Cracks | None | Excellent |
| Sample 5 | OK/Remaining Air (Much) | No Breakage Cracks | Slight Burrs and Rubble Arise | Damage on Resin Mask (Little) |
| Sample 6 | OK/Remaining Air (Little) | — | — | Damage on Resin Mask (Medium) |
| Sample 7 | OK/Remaining Air (Little) | — | — | Damage on Resin Mask (Much) |
| Sample A | — | — | Many Burrs and Rubble Arise | — |
| Sample B | — | Cracks Arise in Coating Layer | Slight Burrs and Rubble Arise | Disability of Peeling-Off |
| Sample C | — | Coating Layer Breaks | Slight Burrs and Rubble Arise | Disability of Peeling-Off |

<<Method for Producing Vapor Deposition Mask>>

Next, a method for producing a vapor deposition mask according to another embodiment of the present disclosure is specifically described using the drawings. The method for producing a vapor deposition mask according to another embodiment of the present disclosure is a method for producing the vapor deposition mask 100 including the metal mask 10 in which the metal mask openings 15 are formed and the resin mask 20 in which the resin mask openings 25 corresponding to a pattern to be produced by vapor deposition are formed at positions overlapping with the metal mask openings 15, the metal mask and the resin mask being stacked, and includes: as shown in FIG. 1(a), a step of preparing the vapor deposition mask preparation body 60 in which the metal mask 10 is provided on one surface of the resin plate 20A for obtaining the resin mask, and the protective sheet 30 with self-adsorption and peelability is adsorbed on the other surface of the resin plate 20A; as shown in FIG. 1(b), a step of irradiating, with respect to the vapor deposition mask preparation body 60, the resin plate 20A with laser light from the metal mask 10 side to form the resin mask openings 25 corresponding to the pattern to be produced by vapor deposition in the resin plate 20A; and as shown in FIG. 1(c), a step of peeling off the protective sheet 30 from the resin mask 20 in which the resin mask openings 25 corresponding to the pattern to be produced by vapor deposition are formed, in other words, a step of peeling off the protective sheet 30 from the vapor deposition mask 100 which is a final production target. Hereafter, differences from the method for producing a vapor deposition mask according to an embodiment of the present disclosure described above are mainly described. Notably, unless otherwise noted, the method for producing a vapor deposition mask according to another embodiment of the present disclosure can properly select the contents of the description of the aforementioned method for producing a vapor deposition mask according to an embodiment of the present disclosure, and the expression of "method for producing a vapor deposition mask according to an embodiment of the present disclosure" only has to be replaced by "method for producing a vapor deposition mask according to another embodiment of the present disclosure".

<Step of Preparing Vapor Deposition Mask Preparation Body>

In the method for producing a vapor deposition mask according to another embodiment of the present disclosure, as the vapor deposition mask preparation body including the resin plate 20A for forming the resin mask openings 25 by irradiation with laser light, the vapor deposition mask preparation body 60 in which the metal mask 10 is provided on one surface of the resin plate 20A, and furthermore, the protective sheet 30 with self-adsorption is adsorbed on the other surface of this resin plate 20A with its self-adsorption is used. According to the method for producing a vapor deposition mask according to another embodiment of the present disclosure, due to the presence of the protective sheet 30 adsorbed on the other surface of the resin plate 20A, out-of-focus blur in irradiating the resin plate 20A with laser light can be prevented, and "burrs" and "rubble" caused by out-of-focus blur can be suppressed from arising. For example, even in the case where a gap arises between the processing stage 70 and the vapor deposition mask preparation body 60 when the vapor deposition mask preparation body 60 is placed on the processing stage 70 to form the resin mask openings 25, out-of-focus blur in irradiating the resin plate 20A with laser light can be prevented.

Moreover, in the method for producing a vapor deposition mask according to another embodiment of the present disclosure, since as the protective sheet 30 constituting the vapor deposition mask preparation body 60, the protective sheet 30 with self-adsorption is used, the self-adsorption can bring the protective sheet 30 in close contact onto the other surface of the resin plate 20A without a gap. Thereby, out-of-focus blur in the occasion when the resin mask openings 25 are formed in the resin plate 20A can be sufficiently suppressed, which enables the resin mask openings 25 which can form a vapor deposition pattern with high definition to be formed. Moreover, the protective sheet 30 adsorbed onto the other surface of the resin plate 20A serves to cover the other surface of the resin plate 20A, even when the resin plate 20A has not been sufficiently decomposed, and in the stage where the resin mask openings 25 are formed in the resin plate 20A, "rubble" of the resin plate 20A arises, the "rubble" can be suppressed from directly sticking onto the other surface of the resin plate 20A.

Furthermore, in the method for producing a vapor deposition mask according to another embodiment of the present disclosure in which method the protective sheet 30 with self-adsorption is used as the protective sheet 30 constituting the vapor deposition mask preparation body 60, the other surface of the resin plate 20A and the protective sheet 30 can be brought into close contact with each other without distortion or the like arising in the resin plate 20A. Notably, in the case where distortion or the like arises in the resin plate 20A when the protective sheet 30 is brought into close contact with the resin plate 20A, this distortion or the like tends to cause dimensional precision and position precision of the resin mask openings 25 formed in the resin plate 20A to deteriorate.

Moreover, in the method for producing a vapor deposition mask according to another embodiment of the present disclosure, strength of recess parts to be the resin mask openings 25 in the final stage and the resin plate 20A near the recess parts can be prevented from deteriorating, and also in this point, "burrs" and "rubble" can be prevented from arising. Specifically, when it is assumed that the protective sheet 30 is a resin plate, an apparent thickness of the resin plate 20A can be increased. In other words, the protective sheet 30 serves to prevent out-of-focus blur, and in addition, serves as a support body for preventing the strength of the resin plate from deteriorating. Notably, by preventing the strength of the recess parts to be the resin mask openings 25 in the final stage and the resin plate 20A near the recess parts from deteriorating with the protective sheet 30 provided on the other surface of the resin plate 20A, in the stage of forming the resin mask openings in the resin plate 20A by irradiation with laser light, parts of the resin plate 20A can be suppressed from being chipped off or undergoing similar action.

Notably, in the case where the resin mask openings 25 are formed in the resin plate 20A in the state where the vapor deposition mask preparation body is fixed to a frame in order to reduce a positioning error of the frame to the vapor deposition mask, when this vapor deposition mask preparation body is the "comparative vapor deposition mask preparation body" in which the protective sheet 30 is not adsorbed on the other surface of the resin plate 20A, the resin plate 20A of the "comparative vapor deposition mask preparation body" and the processing stage 70 cannot be brought into close contact with each other due to the presence of the frame in the occasion of irradiation with laser light, and when the resin mask openings 25 are formed in the state of being fixed to the frame, an extent of out-of-focus blur is large. On the other hand, in the method for producing a vapor deposition mask according to another embodiment of the present disclosure, even when a gap exists between the vapor deposition mask preparation body 60 and the processing stage 70, due to the presence of the protective sheet 30 adsorbed on the other surface of the resin plate 20A, out-of-focus blur can be prevented from arising in the occasion when the resin mask openings 25 are formed in the resin plate 20A.

Notably, while in the above, the case where the resin mask openings 25 are formed in the state where the vapor deposition mask preparation body 60 is placed on the processing stage 70 is exemplarily described, the method for producing a vapor deposition mask according to another embodiment of the present disclosure does not take the placement of the vapor deposition mask preparation body 60 on the processing stage 70 as the essential condition, but the resin mask openings 25 can also be formed by irradiating the resin plate 20A of the vapor deposition mask preparation body with laser light, for example, in the state where the vapor deposition mask preparation body 60 is fixed to a frame without the vapor deposition mask preparation body 60 placed on the processing stage 70, or by another method other than this.

(Example of Method for Producing Vapor Deposition Mask Preparation Body)

As to the vapor deposition mask preparation body 60 used in the method for producing a vapor deposition mask according to another embodiment of the present disclosure, there is no limitation to a method for producing the vapor deposition mask preparation body 60 as long as it satisfies the condition that the metal mask 10 is provided on one surface of the resin plate 20A and the protective sheet 30 with self-adsorption is adsorbed on the other surface of the resin plate 20A.

For example, the vapor deposition mask preparation body 60 can be obtained by preparing the metal mask 10 in which the metal mask openings 15 are beforehand formed, pasting this metal mask 10 on the one surface of the resin plate 20A by a conventionally known method, for example, using an adhesive agent or the like, and adsorbing the protective sheet 30 with self-adsorption on the other surface of the resin plate 20A. Notably, after the protective sheet 30 with self-adsorption is adsorbed on the other surface of the resin plate 20A, the metal mask 10 may be pasted on the one surface of the resin plate 20A.

Moreover, a metal plate for obtaining the metal mask 10 may be prepared to paste this metal plate on the one surface of the resin plate 20A, to form the metal mask openings 15 that penetrate only the metal plate, and then, to adsorb the protective sheet 30 with self-adsorption on the other surface of this resin plate 20A. Notably, the adsorption of the protective sheet 30 with self-adsorption may be performed before the resin plate 20A and the metal plate are pasted together, or may be performed in the stage before the metal mask openings 15 are formed and after the resin plate 20A and the metal plate are pasted together. In other words, the adsorption of the protective sheet 30 may be performed in any stage as long as it is performed before the resin mask openings 25 are formed in the resin plate 20A by irradiation with laser light.

FIGS. 4(a) to 4(d) are schematic cross-sectional views exemplarily showing a method of forming the vapor deposition mask preparation body 60, and in a mode shown in the figure, after the resin plate 20A is provided on the metal plate 10A, the metal mask openings 15 are formed in the metal plate 10A, and after that, the protective sheet 30 with self-adsorption is adsorbed on the surface of the resin plate 20A on the side that is not in contact with the metal mask.

As a method of forming the resin plate 20A on the metal plate 10A, a method of coating and drying of coating liquid obtained by dispersing or dissolving a resin which is a material of the resin plate 20A in an appropriate solvent by a conventionally known coating method, and the like can be cited. Moreover, the resin plate 20A may be pasted on the metal plate 10A via an adhesive layer or the like. In the method, as shown in FIG. 4(a), after the resin plate 20A is provided on the metal plate 10A, the surface of the metal plate 10A is coated with a resist material 62, and the resist material is masked using a mask 63 in which a metal mask opening pattern is formed, and is exposed and developed. Thereby, as shown in FIG. 4(b), a resist pattern 64 is formed on the surface of the metal plate 10A. Then, using the resist pattern 64 as an etching resistant mask, etching processing is performed only on the metal plate 10A, and the resist pattern is cleaned and removed after the etching. Thereby, as shown in FIG. 4(c), a stacked body in which the metal mask 10 configured by forming the metal mask openings 15 in the metal plate 10A is provided on one surface of the resin plate 20A is obtained. Next, as shown in FIG. 4(d), the protective sheet 30 with self-adsorption is adsorbed on the other surface of the resin plate 20A of the obtained stacked body with its self-adsorption, and thereby, the vapor deposition mask preparation body 60 is obtained.

A masking method of the resist material is not specially limited but, as shown in FIG. 4(a), only the surface side, of the metal plate 10A, that is not in contact with the resin plate 20A may be coated with the resist material 62, or the individual surfaces of the resin plate 20A and the metal plate 10A may be coated (not shown) with the resist material 62. Moreover, a dry film method of pasting dry film resist on the surface, of the metal plate 10A, that is not in contact with the resin plate 20A or on the individual surfaces of the resin plate 20A and the metal plate 10A can also be used. A coating method of the resist material 62 is not specially limited but, in the case where only the surface side, of the metal plate 10A, that is not in contact with the resin plate 20A is coated with the resist material 62, a spin coating method or a spray coating method can be used. Meanwhile, when the resin plate 20A and the metal plate 10A are stacked into a long sheet, a dip coating method or the like which can perform coating with a resist material in a roll-to-roll scheme is preferably used. Notably, in the dip coating method, the individual surfaces of the resin plate 20A and the metal plate 10A are to be coated with the resist material 62.

The resist material to be used is preferably excellent in processability with desired resolution. Moreover, an etching agent used in the etching processing is not specially limited but a known etching agent only has to be properly selected.

An etching method of the metal plate 10A is not specially limited but, for example, wet etching methods such as a spray etching method of spraying an etching agent from an injection nozzle at predetermined injection pressure, a dip etching method in an etching solution filled with an etching agent, and a spin etching method of dropping an etching agent, and dry etching methods using gas, plasma and the like can be used.

(Protective Sheet)

The protective sheet 30 constituting the vapor deposition mask preparation body 60 includes self-adsorption and peelability. Notably, the self-adsorption of the protective sheet 30 stated in the specification of the present application means a property with which, by a mechanism of the protective sheet 30 itself, it can be adsorbed on the other surface of the resin plate 20A, and specifically, means a property with which it can be brought into close contact onto the other surface of the resin plate 20A not via an adhesive agent, a pressure-sensitive adhesive agent or the like between the other surface of the resin plate 20A and the protective sheet, and without need for an external mechanism such, for example, as attraction with a magnet or the like between the resin plate 20A and the protective sheet. According to such a protective sheet 30 with self-adsorption, in the occasion when it comes into contact with the resin plate 20A, the protective sheet 30 can be adsorbed onto the resin plate 20A while causing air to escape. Moreover, the peelability of the protective sheet 30 means a property with which peeling-off starts by lifting one end of the protective sheet 30 adsorbed on the resin plate 20A, and the protective sheet 30 adsorbed on the resin plate 20A can be removed by continuing to lift the protective sheet 30 at an appropriate peel angle. Notably, when peeling off the protective sheet 30, the protective sheet 30 is preferably lifted at an appropriate peel angle at which deformation does not arise in the resin plate 20A. The appropriate angle is, for example, not less than about 45° and not more than about 180°, preferable not less than about 90° and not more than about 180°.

As the protective sheet 30 with self-adsorption, for example, the protective sheet 30 on which self-adsorption is expressed due to action of a resin material itself constituting the protective sheet 30 can be used.

The resin material of the protective sheet 30 is not specially limited as long as the resin material can express self-adsorption due to action of the resin material itself, but a conventionally known resin material which can express self-adsorption, such, for example, as an acrylic resin, a silicone-based resin, a urethane-based resin, a polyester resin, an epoxy resin, a polyvinyl alcohol resin, a cycloolefin resin or a polyethylene resin, can be properly selected and used. Above all, according to the protective sheet 30 containing a silicone-based resin which can express self-adsorption, or a urethane-based resin, air escape in the occasion when the protective sheet 30 is adsorbed on the resin plate 20A is excellent, and as compared with the protective sheet 30 containing another resin material, the protective sheet 30 can be adsorbed on the resin plate 20A with excellent close contact. Furthermore, according to the protective sheet 30 containing a silicone-based resin which can express self-adsorption, or a urethane-based resin, peel strength between the resin plate 20A and the protective sheet 30 can be made small, which enables the protective sheet 30 to be peeled off without damaging the resin plate 20A (resin mask 20) in which the resin mask openings 25 are formed in the final stage. In this point, a silicone-based resin which can express self-adsorption, and a urethane-based resin are preferable resin materials as the material of the protective sheet 30. Above all, the urethane-based resin, which can afford higher air escape ability is preferable. Notably, the protective sheet 30 may solely contain one type of resin, or may contain two or more types of resins. Moreover, as the protective sheet 30 in which the resin material itself includes adsorption, for example, a sheet-like object and the like in which a material itself includes adsorption, which is disclosed in Japanese Patent Laid-Open No. 2008-36895, can also be used.

Moreover, in place of the aforementioned protective sheet 30 with self-adsorption due to action of the resin material itself, the protective sheet 30 whose surface includes a cell suction cup structure may be used. The cell suction cup structure means a continuous fine roughness structure formed on the surface, and self-adsorption is given to the protective sheet 30 by this continuous fine roughness structure acting as suction cups. As such a protective sheet 30, for example, a sheet-like object and the like including the cell suction cup structure can be cited, which is disclosed in Japanese Patent Laid-Open No. 2008-36895. Notably, as the resin material of the protective sheet 30 with the cell suction cup structure, a silicone-based resin and a urethane-based resin are preferable.

The protective sheet 30 includes peelability as well as self-adsorption, and in a step of peeling off the protective sheet 30 mentioned later, the protective sheet 30 can be peeled off and removed from the resin mask 20 in which the resin mask opening 25 corresponding to a pattern to be produced by vapor deposition are formed without other separate processing such, for example, as dissolving processing or UV irradiation processing. Notably, when the peelability of the protective sheet 30 from the vapor deposition mask preparation body 60 is low, there can arise a risk that the resin plate 20A (resin mask 20) in which the resin mask openings 25 have been formed is damaged in peeling off the protective sheet 30, which causes precision in dimension, position and the like of the formed resin mask openings 25 to deteriorate. Moreover, there can arise a risk that peeling traces and the like remain in the resin mask 20 in which the resin mask openings 25 are formed (synonymous to the resin plate 20A in which the resin mask openings are formed). With these points taken into consideration, as the protective sheet 30, a protective sheet with peel strength not less than about 0.0004 N/10 mm and less than about 0.2 N/10 mm in conformity with JIS Z-0237:2009 is preferably used, a protective sheet with peel strength not less than about 0.0012 N/10 mm and not more than about 0.012 N/10 mm is still preferably used, a protective sheet with peel strength not less than about 0.002 N/10 mm and not more than about 0.04 N/10 mm is further preferably used, and a protective sheet with peel strength not less than about 0.002 N/10 mm and not more than about 0.02 N/10 mm is still further preferably used. By setting the vapor deposition mask preparation body 60 in which the protective sheet 30 with such peel strength is adsorbed on the other surface of the resin plate 20A, damage on the resin mask 20 in which the resin mask openings 25 are formed in peeling off the protective sheet 30 from the resin mask 20 in which the resin mask openings 25 are formed, and peeling traces and the like arising in this resin mask 20 can be suppressed.

The protective sheet 30 in preferable modes includes about 70% or more of transmittance at a wavelength of laser light for forming the resin mask openings 25 in the resin plate 20A, preferably about 80% or more thereof. According to the protective sheet 30 in preferable modes, in the occasion of irradiation with laser light to form the resin mask openings 25 in the resin plate 20A, the protective sheet 30 can be suppressed from being decomposed with this laser light. Thereby, various problems caused by decomposition of the protective sheet 30, for example, that "rubble" arising due to decomposition of the protective sheet 30 causes sticking or similar action onto the inner wall surfaces of the resin mask openings 25 formed in the resin plate 20A, can be suppressed. Notably, the wavelength of laser light is different depending on types of laser light used, and, for example, when a polyimide resin is used as the material of the resin plate 20A, YAG laser, excimer laser or the like is used. Notably, for fine processing, YAG laser (third harmonic generation) with 355 nm of wavelength of laser light, and excimer laser (KrF) with 248 nm of wavelength of laser light are suitable. Accordingly, when the protective sheet 30 is selected, the material of the protective sheet 30 only has to be properly selected such that the transmittance of laser light is the aforementioned preferable transmittance in accordance with a type of laser used. Moreover, as a method of setting the transmittance of the protective sheet 30 containing a silicone-based resin or a urethane-based resin which is exemplarily cited as the aforementioned preferable resin material and can express self-adsorption to be within the range of the aforementioned preferable transmittance, a method of making the thickness of the protective sheet 30 containing the silicone-based resin or the urethane-based resin thin can be cited. The same holds true for cases where as the resin material which ca express self-adsorption, a resin material other than the silicone-based resin and the urethane-based resin is used. Moreover, also by using a resin material or the like that can express self-adsorption and is high in transparency, the transmittance can be adjusted to be with in the aforementioned preferable range.

The thickness of the protective sheet 30 is not specially limited but preferable not less than about 1 μm and not more than about 100 μm, still preferably not less than about 2 μm and not more than about 75 μm, further preferably not less than about 2 μm and not more than about 50 μm, particularly preferably not less than about 3 μm and not more than about 30 μm. By setting the thickness of the protective sheet 30 to be within the aforementioned preferable range, specifically, by setting the lower limit value of the thickness of the protective sheet 30 to be the aforementioned preferable thickness, trackability of the protective sheet 30 to the resin plate 20A can be enhanced, and thereby, close contact between the resin plate 20A and the protective sheet 30 can be further improved. Moreover, by setting the thickness of the protective sheet 30 to be not less than about 1 μm, strength of the protective sheet 30 can be sufficiently enhanced, and when the resin mask openings are formed by irradiating the resin plate 20A with laser light, risks or the like that the protective sheet 30 breaks and that the protective sheet 30 suffers cracks can be reduced. In particular, when the thickness of the protective sheet 30 is set to be not less than about 3 μm, these risks can be further reduced. Moreover, by setting the upper limit value of the thickness of the protective sheet 30 to be the aforementioned preferable thickness, a component constituting the protective sheet 30 can be sufficiently suppressed from being transferred to the resin plate 20A side, and moreover, air escape ability can be further enhanced.

Moreover, as the protective sheet 30, a support member-integrated protective sheet (not shown) in which the protective sheet 30 is supported on a support member can also be used. With the support member-integrated protective sheet, even when the thickness of the protective sheet 30 itself is made thin, handling ability and the like of the protective sheet 30 can be made excellent. The thickness of the support member is not specially limited but can be properly set in accordance with the thickness of the protective sheet 30, preferably not less than about 3 μm and not more than about 200 μm, still preferably not less than about 3 μm and not more than about 150 μm, further preferably not less than about 3 μm and not more than about 100 μm, particularly preferably not less than about 10 μm and not more than about 75 μm.

The material of the support member is not specially limited but a resin material, a glass material and the like can be used, and the resin material is preferably used in view of flexibility and the like.

The protective sheet 30 is adsorbed on the other surface of the resin plate 20A and at a position overlapping with the resin mask openings 25 formed in the resin plate 20A in the final stage in the thicknesswise direction. As the protective sheet 30, one protective sheet 30 may be solely used, or a plurality of protective sheets 30 may be used. In a mode shown in FIGS. 5(*a*) and 5(*b*), one protective sheet 30 is adsorbed on the other surface of the resin plate 20A. Notably, FIG. 5(*a*) is an elevation view of an exemplary vapor deposition mask preparation body 60 as seen from the protective sheet 30 side, and FIG. 5(*b*) is a schematic cross-sectional view thereof. While in the mode shown in FIGS. 5(*a*)-(*b*), the length of the protective sheet 30 in the crosswise direction (horizontal direction in the figure) is made shorter than the length of the resin plate 20A in the crosswise direction, the length of the protective sheet 30 in the crosswise direction may be set to be the same length as the length of the resin plate 20A in the crosswise direction, and the end face of the protective sheet 30 may coincide with the end face of the resin plate 20A in planar position, or the length of the protective sheet 30 in the crosswise direction may be set to be longer than the length of the resin plate 20A in the crosswise direction, and the outer circumference of the protective sheet 30 may be caused to protrude from the resin plate 20A. The same holds true for the length of the protective sheet 30 in the lengthwise direction. Moreover, the same holds true for protective sheets 30 in various modes mentioned later.

As shown in FIGS. 6(*a*) and 6(*b*), as to the protective sheet 30 in a preferable mode, a plurality of protective sheets 30 are adsorbed on the other surface of the resin plate 20A. According to this mode, even when upsizing the resin plate 20A, in other words, even when upsizing the vapor deposition mask 100 produced in the final stage, a risk that air remains between the other surface of the resin plate 20A and each protective sheet 30 can be reduced by downsizing the dimension of each protective sheet 30, which can simply enhance close contact between the resin plate 20A and the protective sheet 30. Furthermore, even when, in the occasion when the protective sheet 30 is adsorbed on the other surface of the resin plate 20A, air remains between the resin plate 20A and partial protective sheets 30 out of the plurality of protective sheets 30, only the protective sheets 30 on which the air and the like remains are needed to be adsorbed again on the other surface of the resin plate 20A, which is preferable also in view of work efficiency.

The dimension or the like of the protective sheet 30 in the case where a plurality of protective sheets 30 are adsorbed is not specially limited but, for example, it may be a dimension with which one or a plurality of resin mask openings 25 of resin mask openings formed in the final stage can be covered, or may be a dimension with which "one screen" mentioned later or a plurality of screens can be covered. As to the protective sheet 30 in a preferable mode, each of the plurality of protective sheets 30 includes a dimension with which it overlaps with the "one screen" or the plurality of screens formed in the resin plate 20A in the final stage. In particular, since as to a vapor deposition mask in a preferable mode mentioned later, an interval between the screens is wider than an interval between the resin mask openings 25, in view of workability, the protective sheet 30 preferable includes a dimension with which it covers the "one screen" or the plurality of screens, and is preferably adsorbed at a position overlapping with the "one screen" or the plurality of screens in the thicknesswise direction. Notably, in FIGS. 6(*a*)-(*b*), each region enclosed by a dotted line is an arrangement scheduled region of the "one screen".

While in the mode shown in FIGS. 6(*a*)-(*b*), the plurality of protective sheets 30 are regularly adsorbed in the lengthwise direction and the crosswise direction of the vapor deposition mask preparation body (the vertical direction and the horizontal direction in the figure) as the vapor deposition mask preparation body 60 is seen from the protective sheet 30 side in plan view, as shown in FIG. 7(*a*), a plurality of protective sheets 30 extending in the lengthwise direction may be adsorbed in the crosswise direction, or as shown in FIG. 7(*b*), a plurality of protective sheet 30 extending in the crosswise direction may be adsorbed in the lengthwise direction. Moreover, as shown in FIG. 7(*c*), a plurality of protective sheets 30 may be alternately adsorbed at random.

<Step of Forming Resin Mask Opening>

As shown in FIG. 1(*b*), this step is a step of irradiating, with respect to the vapor deposition mask preparation body 60 prepared above, the resin plate 20A with laser light through the metal mask openings 15 from the metal mask 10 side to form the resin mask openings 25 corresponding to a pattern to be produced by vapor deposition in the resin plate 20A. Notably, while in the mode shown in the figure, irradiation with laser light is performed with respect to the vapor deposition mask preparation body 60 placed on the processing stage 70, the processing stage 70 is an arbitrary configuration in the method for producing a vapor deposition mask according to another embodiment of the present disclosure, and the resin mask openings 25 may be formed without the vapor deposition mask preparation body 60 placed on the processing stage 70.

A laser apparatus used in this step is not specially limited but a conventionally known laser apparatus is sufficient to be used. Moreover, the pattern to be produced by vapor deposition in the specification of the present application means a pattern to be produced using the vapor deposition mask, and, for example, when the vapor deposition mask is used for forming an organic layer of an organic EL element, it is the shape of the organic layer.

<Step of Fixing Vapor Deposition Mask Preparation Body to Frame>

The method for producing a vapor deposition mask according to another embodiment of the present disclosure may include a step of fixing the vapor deposition mask preparation body 60 to a frame, between arbitrary steps before forming the resin mask openings 25, or after these steps. While this step is an arbitrary step in the method for producing a vapor deposition mask of an embodiment of the present invention, by beforehand fixing the vapor deposition mask preparation body 60 to a frame in the stage before irradiation with laser light to form the resin mask openings 25 in the resin plate 20A, an attachment error arising in fixing the obtained vapor deposition mask 100 to a frame can be made zero. Notably, in pace of fixing the vapor deposition mask preparation body 60 to a frame, after fixing, to a frame, a stacked body in which the metal mask 10 is provided on one surface of the resin plate 20A, or a stacked body in which the metal plate 10A for obtaining the metal mask is provided on one surface of the resin plate 20A, the protective sheet 30 with self-adsorption may be adsorbed on the other surface of the resin plate 20A in the stacked body.

Fixation of the vapor deposition mask preparation body to a frame may be performed on the surface of the frame or may be performed on the lateral face of the frame.

Notably, while when laser processing is performed in the state where the vapor deposition mask preparation body 60 is fixed to a frame, depending on the fixing mode of the vapor deposition mask preparation body 60 to the frame, a gap arises between the vapor deposition mask preparation body 60 and the processing stage 70, or a gap microscopically arises due to insufficient close contact between the vapor deposition mask preparation body 60 and the processing stage 70, since the vapor deposition mask preparation body 60 takes a configuration in which the protective sheet 30 is adsorbed on the other surface of the resin plate 20A, the presence of the protective sheet 30 enables deterioration in strength of the resin plate 20A and out-of-focus blur that can arise due to the gap between the resin plate 20A and the processing stage 70 to be prevented. Accordingly, the method for producing a vapor deposition mask according to another embodiment of the present disclosure is particularly preferable in the case where the resin mask openings 25 are formed in the state where the vapor deposition mask preparation body 60 is fixed to a frame. As the frame, the frame described for the aforementioned method for producing a vapor deposition mask according to an embodiment of the present disclosure can be properly selected and used, and its detailed description is herein omitted.

<Step of Peeling Off Protective Sheet>

As shown in FIG. 1(*c*), this step is a step of peeling off and removing the protective sheet 30 from the resin mask 20 after the resin mask openings 25 are formed in the resin plate 20A of the vapor deposition mask preparation body to obtain the resin mask 20. In other words, it is a step of peeling off and removing the protective sheet 30 from the vapor deposition mask. Via this step, the vapor deposition mask 100 including the metal mask 10 in which the metal mask openings are formed and the resin mask 20 in which the resin mask openings 25 corresponding to a pattern to be produced by vapor deposition are formed at positions overlapping with the metal mask openings 15, the metal mask and the resin mask being stacked, is obtained.

As described above, since the protective sheet 30 includes peelability, the protective sheet 30 can be peeled off simply from the resin mask 20 in which the resin mask openings 25 are formed only by lifting the protective sheet 30 without other separate processing such, for example, as dissolving processing or UV processing for removing the protective sheet. Moreover, since the protective sheet 30 is adsorbed on the other surface of the resin plate 20A with its self-adsorption, the surface of the resin plate 20A (resin mask 20) in which the resin mask openings 25 are formed is not contaminated with the material of the protective sheet 30 and the like, and cleaning processing or the like is not needed.

According to the method for producing a vapor deposition mask according to another embodiment of the present disclosure described above, the presence of the protective sheet 30 enables a vapor deposition mask including the resin mask 20 including the resin mask openings 25 with high definition and the metal mask, the resin mask and the metal mask being stacked, to be produced in an excellent yield.

Next, predominance of the method for producing a vapor deposition mask according to another embodiment of the present disclosure by which method resin mask openings are formed in the resin plate 20A in the state where the protective sheet 30 with self-adsorption is pasted on the other surface of the resin plate 20A of the vapor deposition mask preparation body 60 is described.

Each support member-integrated protective sheet presented in Table 2 below (samples (1-1) to (1-7)) was pasted on the other surface of a resin plate of a vapor deposition mask preparation body such that the resin plate and the protective sheet opposed each other, the resin mask openings 25 were formed by irradiation with laser light from the metal mask side, and adsorption and air escape ability between the resin plate 20A and the protective sheet, durability of the protective sheet in laser processing, and the presence or absence of burrs and rubble, in this stage, were examined. Moreover, after the laser processing, peelability in the occasion when the support member-integrated protective sheet was peeled off from the resin plate (resin mask in which the resin mask openings were formed) was also examined. Notably, for sample (1-A), the resin mask openings were formed in the resin plate without providing a support member-integrated protective sheet. Moreover, for samples (1-6) and (1-7), only evaluations of adsorption, air escape ability and peelability were performed.

In each vapor deposition mask preparation body used, a metal mask (invar material, 40 μm of thickness) in which metal mask openings were formed was provided on one surface of a resin plate (polyimide resin, 5 μm of thickness), and each support member-integrated protective sheet presented in Table 2 below was provided on the other surface of the resin plate. For laser processing, YAG laser with 355 nm of wavelength was used. Table 2 below presents thicknesses of a support member and a protective sheet constituting each support member-integrated protective sheet, and the transmittance of each protective sheet at 355 nm of wavelength. Measurement of peel strength was in conformity with JIS Z-0237:2009, and was performed by using a test plate obtained by pasting a test tape (polyimide film (polyimide tape 5413, 3M Japan Limited) having a pressure-sensitive adhesive agent on its surface) on a stainless steel plate such that the stainless steel plate and the pressure-sensitive adhesive agent opposed each other, pasting each protective sheet as a test piece (samples (1-1) to (1-7)) on this polyimide film of the test plate, and measuring peel strength (relative to polyimide) in the occasion when the protective sheet as the test piece was peeled off at 180° from the polyimide film as the test plate with an electromechanical universal testing instrument (5900 series, Instron Japan Company Limited). Table 2 presents the evaluation results.

Moreover, in order to show relation between the thickness of the protective sheet provided on the other surface of the resin plate 20A and damage that the protective sheet suffered in the laser processing, sample (1-B) was set by forming a layer with 1 μm of thickness and 1% of transmittance at 355 nm of wavelength (layer not including self-adsorption) on the other surface of the resin plate 20A by coating. Moreover, sample (1-C) was set by forming a layer with 0.5 μm of thickness and 1% of transmittance at 355 nm of wavelength (layer not including self-adsorption) on the other surface of the resin plate 20A by coating. For these samples (1-B) and (1-C), evaluation of the presence or absence of burrs and rubble, and durability of the coating layer in the laser processing, were performed. Notably, as the material of the coating layer, a polyimide resin (PHOTONEECE DL-1602, Toray Industries Inc.) was used.

Report of Tests
a) Name of the Standard: JIS Z-0237:2009
b) Test Method: Method 2, the tape was a polyimide tape 5413 (3M Japan Limited)
c) Identification of Samples: Product Numbers (product Names) presented in the table
d) Test Date and Test Site: Sep. 3 and Dec. 7, 2015, Kashiwa City, Chiba Prefecture
e) Test Results: Interface Breakage
Miscellaneous) Measurement Apparatus: Electromechanical Universal Testing Instrument (5900 series, Instron Japan Company Limited)

As apparent from the results in Table 2 below, according to samples (1-1) to (1-5) for which the resin mask openings were formed in the resin plate 20A with respect to the vapor deposition mask preparation body in which the protective sheet 30 was provided on the other surface of the resin plate 20A, as compared with sample (1-A) for which the resin mask openings were formed in the resin plate 20A without providing the protective sheet 30 on the other surface of the resin plate 20A, burrs and rubble could be suppressed from arising, and the resin mask openings with high definition could be formed. Moreover, by using the protective sheet with self-adsorption as the protective sheet 30, after the resin mask openings were formed, the protective sheet could be simply peeled off. In particular, for samples (1-1), (1-2) and (1-4) for which the protective sheets constituted of a urethane-based resin and a silicone-based resin were used as the protective sheets with self-adsorption, extremely excellent results in evaluation of air escape ability and peelability could be obtained. Moreover, as compared with sample (1-7) for which the protective sheet with peel strength not less than about 0.2 N/10 mm was used, for samples (1-1) to (1-6) for which the protective sheets with peel strength less than about 0.2 N/10 mm were used, damage on the resin mask in peeling off the protective sheet could be reduced. Moreover, according to samples (1-1) to (1-5) for which the protective sheets with peel strength not more than about 0.04 N/10 mm were used, particularly according to samples (1-1), (1-2) and (1-4) for which the protective sheets with peel strength not more than about 0.02 N/10 mm were used, damage which the resin mask suffered in peeling-off could be further reduced. Moreover, for sample (1-B) for which a coating layer with 1 μm of thickness was provided in place of the protective sheet with self-adsorption, cracks arose in the coating layer in laser processing, and for sample C for which a coating layer with 0.5 μm of thickness was provided, the coating layer broke in laser processing. Moreover, for samples B and C for which the transmittance was set to be less than about 70%, the coating layer was processed with laser light by the coating layer absorbing the laser light, which caused burrs and rubble due to this to slightly arise.

TABLE 2

| | | Protective Sheet | | | | |
|---|---|---|---|---|---|---|
| | | Resin Material | | Thickness (μm) | Transmittance (355 nm)(%) | Peel Force (Relative to Polyimide) N/10 mm | Support Member |
| Sample 1-1 | Urethane-Based | UA-3004ASL Sumiron Co, Ltd. | 7 | 83 | 0.008 | PET 38 μm |
| Sample 1-2 | Urethane-Based | MASTACK ZUPF-5001 Fujimori Kogyo Co. Ltd. | 10 | 83 | 0.016 | PET 50 μm |
| Sample 1-3 | Acrylic | EC-9000ASL Sumiron Co, Ltd. | 7 | 82 | 0.024 | PET 38 μm |
| Sample 1-4 | Silicone-Based | FIXFILM STD1 Fujicopian Co. Ltd. | 25 | 79 | 0.004 | PET 25 μm |
| Sample 1-5 | Acrylic | MASTACK PC-542PA Fujimori Kogyo Co. Ltd. | 4 | 82 | 0.04 | PET 50 μm |
| Sample 1-6 | Acrylic | EC-625 Sumiron Co, Ltd. | — | — | 0.1 | Polyethylene 55 μm (including Thickness of Protective Sheet) |

TABLE 2-continued

| Sample | | | | | | |
|---|---|---|---|---|---|---|
| Sample 1-7 | Acrylic | PP40-R-KG2 Nichiei Kakoh Co. Ltd. | — | — | 0.2 | Polypropylene 40 μm |
| Sample 1-A | | | Without Protective Sheet | | | |
| Sample 1-B | Coating Layer without Self-Adsorption | | 1 | 1 | — | — |
| Sample 1-C | Coating Layer without Self-Adsorption | | 0.5 | 1 | — | — |

| | Adsorption/Air Escape Ability | Laser Durability (Presence or Absence of Deformation of Protective Sheet) | Presence or Absence of Burrs and Rubble | Peelability |
|---|---|---|---|---|
| Sample 1-1 | OK/Remaining Air (Little) | No Breakage Cracks | None | Excellent |
| Sample 1-2 | OK/Remaining Air (Little) | No Breakage Cracks | None | Excellent |
| Sample 1-3 | OK/Remaining Air (Medium) | No Breakage Cracks | None | Damage on Resin Mask (Little) |
| Sample 1-4 | OK/Remaining Air (None) | No Breakage Cracks | None | Excellent |
| Sample 1-5 | OK/Remaining Air (Much) | No Breakage Cracks | Slight Burrs and Rubble Arise | Damage on Resin Mask (Little) |
| Sample 1-6 | OK/Remaining Air (Little) | — | — | Damage on Resin Mask (Medium) |
| Sample 1-7 | OK/Remaining Air (Little) | — | — | Damage on Resin Mask (Much) |
| Sample 1-A | — | — | Many Burrs and Rubble Arise | — |
| Sample 1-B | — | Cracks Arise in Coating Layer | Slight Burrs and Rubble Arise | Disability of Peeling-Off |
| Sample 1-C | — | Coating Layer Breaks | Slight Burrs and Rubble Arise | Disability of Peeling-Off |

(Vapor Deposition Mask Produced by Method for Producing Vapor Deposition Mask)

Figure 9:
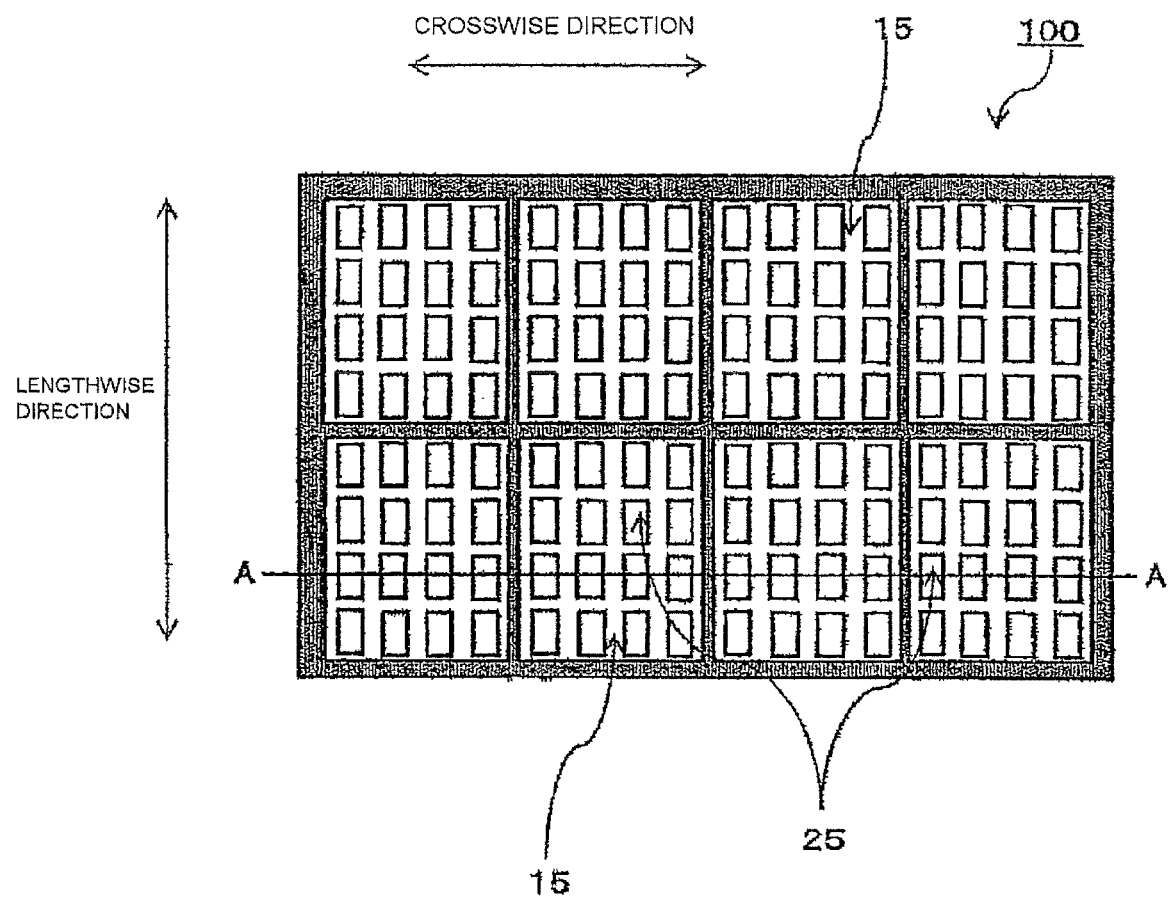
FIG. 9(a) is an elevation view of a vapor deposition mask produced by a method for producing a vapor deposition mask of an embodiment as seen from the metal mask side in plan view.
FIG. 9(b) is a schematic cross-sectional view taken along the A-A line in FIG. 9(a).
Figure 9:
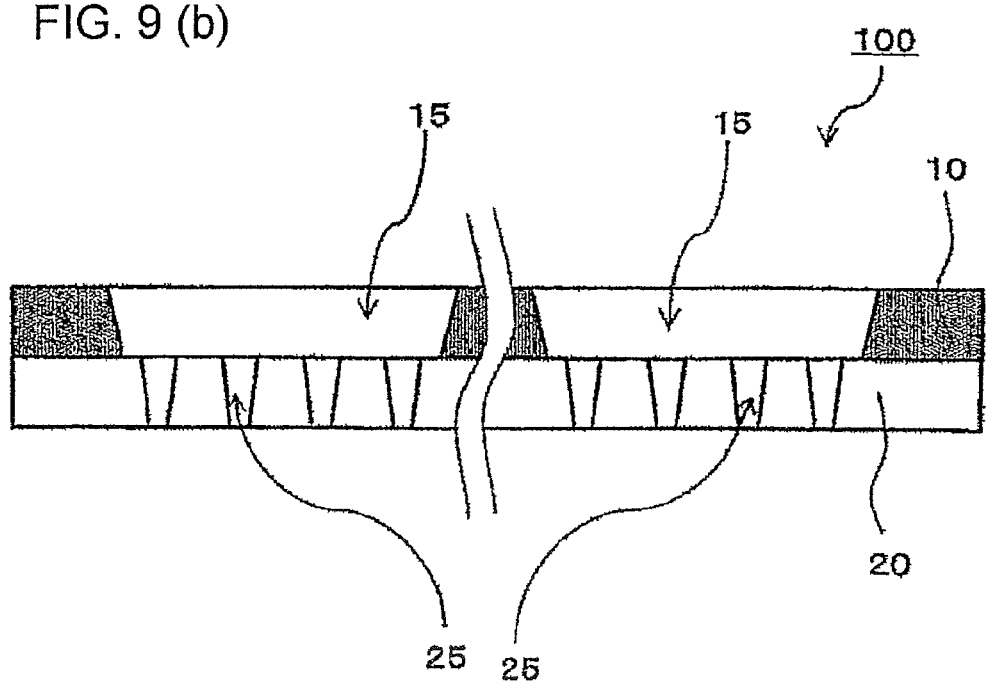

FIG. 9(a) is an elevation view of a vapor deposition mask produced by the method for producing a vapor deposition mask according to each embodiment of the present disclosure as seen from the metal mask side, and FIG. 9(b) is a schematic cross-sectional view taken along the A-A line in FIG. 9(a).

While in the mode shown in the figure, the opening shape of the resin mask opening 25 exhibits a rectangular shape, the opening shape is not specially limited but the opening shape of the resin mask opening 25 may be rhombic or polygonal or may be a shape having a curvature such as a circle and an ellipsoid. Notably, it can be said that the rectangular or polygonal opening shape is a preferable opening shape of the resin mask opening 25 in view of capability of securing a larger area of light emission as compared with the opening shape having a curvature such as a circle and an ellipsoid.

(Resin Mask)

The material of the resin mask 20 is not limited but, for example, a material that enables formation of the resin mask openings 25 with high definition by laser processing or the like, includes a low rate of dimensional change and a low rate of humidity absorption under heat and with passage of time, and is light weight is preferably used. As such materials, a polyimide resin, a polyamide resin, a polyamide-imide resin, a polyester resin, a polyethylene resin, a polyvinyl alcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials exemplarily cited above, resin materials with the thermal expansion coefficients of about 16 ppm/° C. or less are preferable, resin materials with the rates of humidity absorption of about 1.0% or less are preferable, and resin materials including both conditions are particularly preferable. The resin mask using these resin materials enables dimensional precision of the resin mask openings 25 to be improved and a rate of dimensional change and a rate of humidity absorption under heat and with passage of time to be small. Accordingly, as the resin plate 20A which is to be the resin mask 20 in the final stage and constitutes the vapor deposition mask preparation body, a resin plate constituted of a preferable resin material, for example, exemplarily cited above is preferable used.

The thickness of the resin mask 20 is not specially limited but, in the case of further improving the effect of suppressing generation of a shadow, the thickness of the resin mask 20 is preferably not more than about 25 µm, still preferably less than about 10 µm. A preferable range of the lower limit value is not specially limited but, in the case where the thickness of the resin mask 20 is less than about 3 µm, defects such as a pinhole tend to arise and a risk of deformation or the like increases. In particular, by setting the thickness of the resin mask 20 to be not less than about 3 µm and less than about 10 µm, still preferably not less than about 4 µm and not more than about 8 µm, the influence of a shadow in formation of a high definition pattern exceeding 400 ppi can be more effectively prevented. Moreover, while the resin mask 20 may be directly bonded to the metal mask 10 mentioned later or may be bonded thereto via a pressure-sensitive adhesive agent layer, in the case where the resin mask 20 is bonded to the metal mask 10 via the pressure-sensitive adhesive agent layer, the total thickness of the resin mask 20 and the pressure-sensitive adhesive agent layer is preferably within the aforementioned preferable thickness range. Notably, the shadow is a phenomenon that a part of a vapor deposition material released from a vapor deposition source collides with inner wall surfaces of the metal mask opening of the metal mask and/or the resin mask opening of the resin mask and does not reach the vapor deposition target, and thereby, a portion without vapor deposition that has a film thickness smaller than the intended vapor deposition film thickness arises. Accordingly, the thickness of the resin plate 20A which is to be the resin mask 20 in the final stage and constitutes the vapor deposition mask preparation body is preferably the aforementioned thickness. Notably, while the resin plate 20A may be bonded to the metal mask 10 via a pressure-sensitive adhesive agent layer or an adhesive agent layer, or the resin plate 20A may be directly bonded to the metal plate, in the case where the resin plate is bonded to the metal mask 10 via the pressure-sensitive adhesive agent layer or the adhesive agent layer, with the aforementioned shadow taken into consideration, the total thickness of the resin plate 20A and the pressure-sensitive adhesive agent layer or the resin plate 20A and the adhesive agent layer is preferably set to be within the aforementioned preferable range.

The sectional shape of the resin mask opening 25 is not specially limited but end surfaces that face each other and are of the resin mask forming the resin mask openings 25 may be substantially parallel to each other, but as shown in FIG. 9(b), the sectional shape of the resin mask opening 25 is preferably a shape including broadening toward a vapor deposition source. In other words, it preferably includes a taper surface including broadening toward the metal mask 10 side. While a taper angle can be properly set with the thickness or the like of the resin mask 20 taken into consideration, an angle formed by a straight line connecting the lower bottom distal end in the resin mask opening of the resin mask and the upper bottom distal end of the resin mask opening of the same resin mask and the bottom surface of the resin mask, in other words, an angle formed by an inner wall surface of the resin mask opening 25 and a surface of the resin mask 20 on the side that is not in contact with the metal mask 10 (lower surface of the resin mask in the mode shown in the drawings) in the thicknesswise cross section of the inner wall surface constituting the resin mask opening 25 of the resin mask 20 is preferably within a range not less than about 5° and not more than about 85°, still preferably within a range not less than about 15° and not more than about 75°, further preferably within a range not less than about 25° and not more than about 65°. In particular, within this range, it is preferably an angle smaller than a vapor deposition angle of a vapor deposition machine to be used. Moreover, in the mode shown in the drawings, while an end surface that forms the resin mask opening 25 exhibits a linear shape, there is no limitation thereto but may be in a curved shape convex outward, in other words, a shape of the entirety of the resin mask opening 25 may be a bowl shape. Such a resin mask opening 25 including the sectional shape can be formed by properly adjusting an irradiation position with laser in the occasion when the resin mask opening 25 is formed in the resin plate 20A and irradiation energy of the laser, or by performing multi-stage laser irradiation in which the irradiation position is changed in stages.

(Metal Mask)

As shown in FIG. 9(b), the metal mask 10 is stacked on one surface of the resin mask 20. The metal mask 10 is constituted of metal, in which the metal mask openings 15 extending in the lengthwise direction or the crosswise direction are arranged. The metal mask opening 15 is synonymous with an opening and sometimes referred to as slit. An arrangement example of the metal mask openings is not specially limited but the metal mask openings extending in the lengthwise direction and the crosswise direction may be arranged in a plurality of rows in the lengthwise direction and the crosswise direction, the metal mask openings extending in the lengthwise direction may be arranged in a plurality of rows in the crosswise direction, and the metal mask openings extending in the crosswise direction may be arranged in a plurality of rows in the lengthwise direction. Moreover, they may be arranged in only one row in the lengthwise direction or the crosswise direction. Notably, "lengthwise direction" and "crosswise direction" stated in the specification of the present application indicate the vertical direction and the horizontal direction in the drawings, respectively, and may be any directions of the longitudinal directions and the width directions of the vapor deposition mask, the resin mask and the metal mask. For example, the longitudinal direction of the vapor deposition mask, the resin mask or the metal mask may be set to be the "lengthwise direction", or the width direction thereof may be set to be the "lengthwise direction". Moreover, while in the specification of the present application, the case where the shape of the vapor deposition mask in plan view is a rectangular shape is exemplarily described, it may be another shape such, for example, as a circular shape and a polygonal shape such as a rhombic shape. In this case, the longitudinal direction of the diagonal line, the radial direction, or any direction only has to be set as the "longitudinal direction", the direction perpendicular to the "longitudinal direction" being set as the "width direction (sometimes referred to as short-side direction)".

The material of the metal mask 10 is not specially limited but a conventionally known one in the field of the vapor deposition mask can be properly selected and used, and, for example, metal materials such as stainless steel, iron-nickel alloy and aluminum alloy can be cited. Above all, an invar material which is iron-nickel alloy can be preferably used since an invar material is hardly deformed by heat.

While the thickness of the metal mask 10 is not specially limited but, in order to more effectively prevent generation of a shadow, is preferably not more than about 100 µm, still preferably not more than about 50 µm, particularly preferably not more than about 35 µm. Notably, in the case of being thinner than about 5 µm, risks of rupture and deformation tend to increase and handling tends to be difficult.

Moreover, while in the mode shown in FIG. 9(a), the opening shape of the metal mask opening 15 in plan view exhibits a rectangular shape, the opening shape is not specially limited but the opening shape of the metal mask opening 15 may be any shape such as a trapezoid and a circle.

The sectional shape of the metal mask opening 15 formed in the metal mask 10 is not specially limited but, as shown in FIG. 9(b), is preferably a shape including broadening toward a vapor deposition source. More specifically, an angle formed by a straight line connecting the lower bottom distal end in the metal mask opening 15 of the metal mask 10 and the upper bottom distal end in the metal mask opening 15 of the same metal mask 10 and the bottom surface of the metal mask 10, in other words, an angle formed by an inner wall surface of the metal mask opening 15 and a surface of the metal mask 10 on the side that is in contact with the resin mask 20 (lower surface of the metal mask in the mode shown in the figure) in the thicknesswise cross section of the inner wall surface constituting the metal mask opening 15 of the metal mask 10 is preferably within a range not less than about 5° and not more than about 85°, still preferably within a range not less than about 15° and not more than about 80°, further preferably within a range not less than about 25° and not more than about 65°. In particular, within this range, it is preferably an angle smaller than a vapor deposition angle of a vapor deposition machine to be used.

Hereafter, vapor deposition masks in preferable modes produced by the methods for producing a vapor deposition mask according to embodiments of the present disclosure are described, exemplified by Embodiment (A) and Embodiment (B).

<Vapor Deposition Mask of Embodiment (A)>

Figure 10:
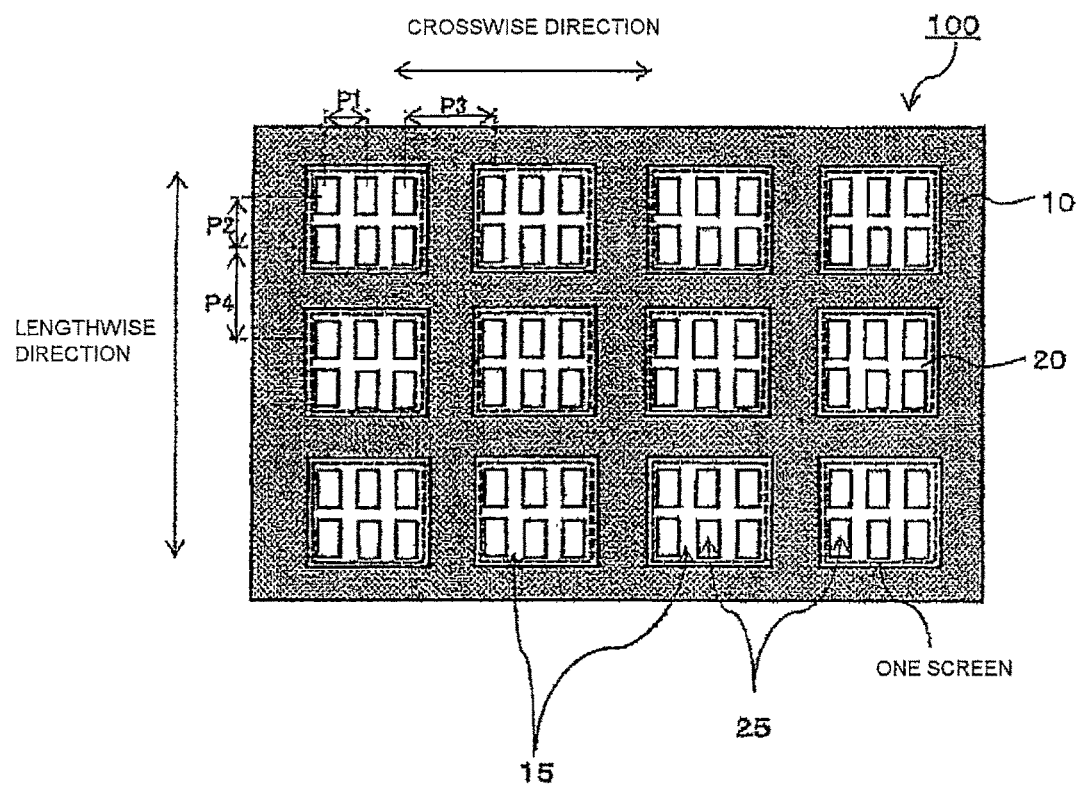
FIG. 10 is an elevation view of a vapor deposition mask of Embodiment (A) as seen from the metal mask side in plan view.
Figure 11:
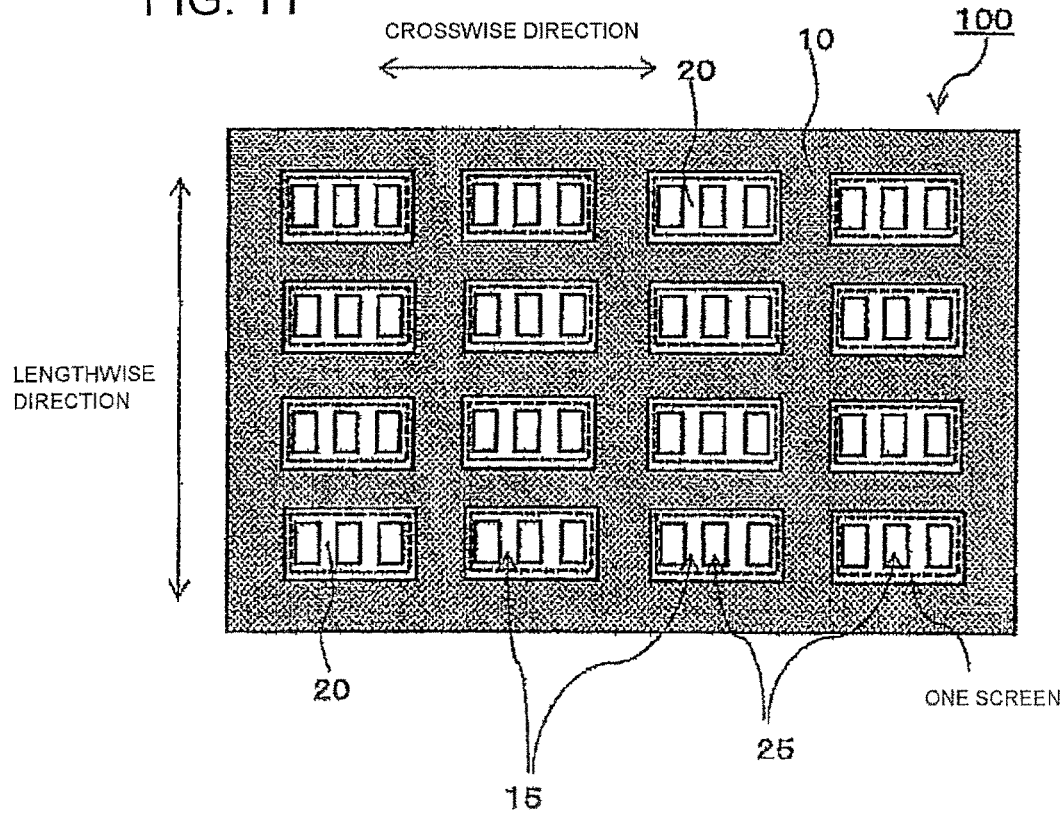
FIG. 11 is an elevation view of a vapor deposition mask of Embodiment (A) as seen from the metal mask side in plan view.
Figure 12:
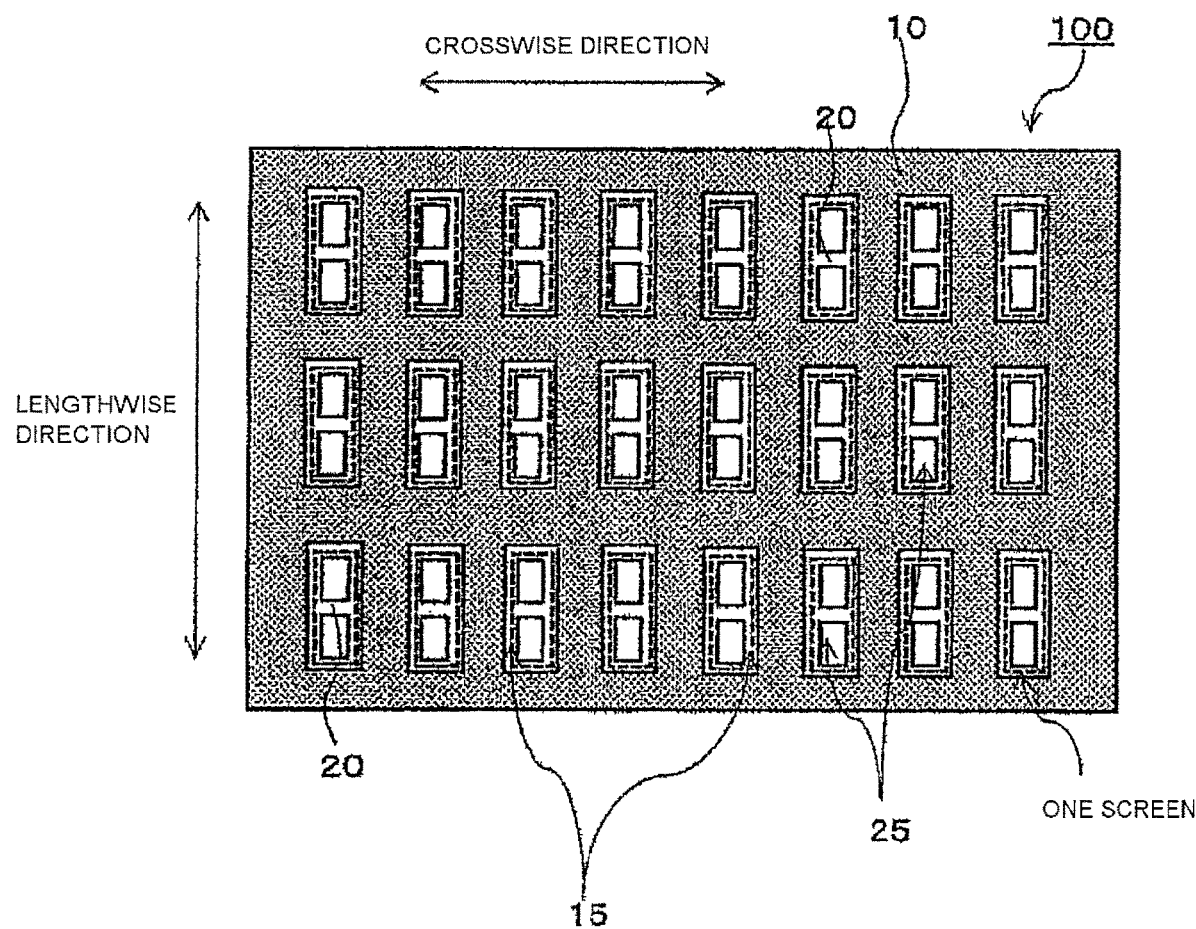
FIG. 12 is an elevation view of a vapor deposition mask of Embodiment (A) as seen from the metal mask side in plan view.
Figure 13:
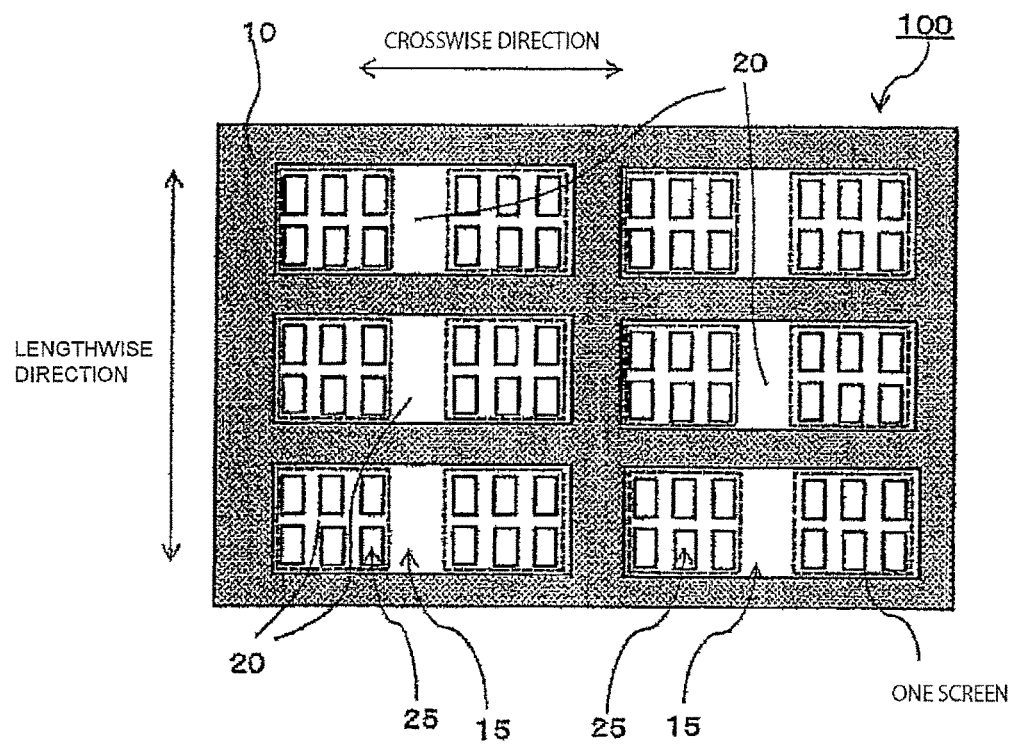
FIGS. 13(a) and 13(b) are elevation views of vapor deposition masks of Embodiment (A) as seen from the metal mask side in plan view.
Figure 13:
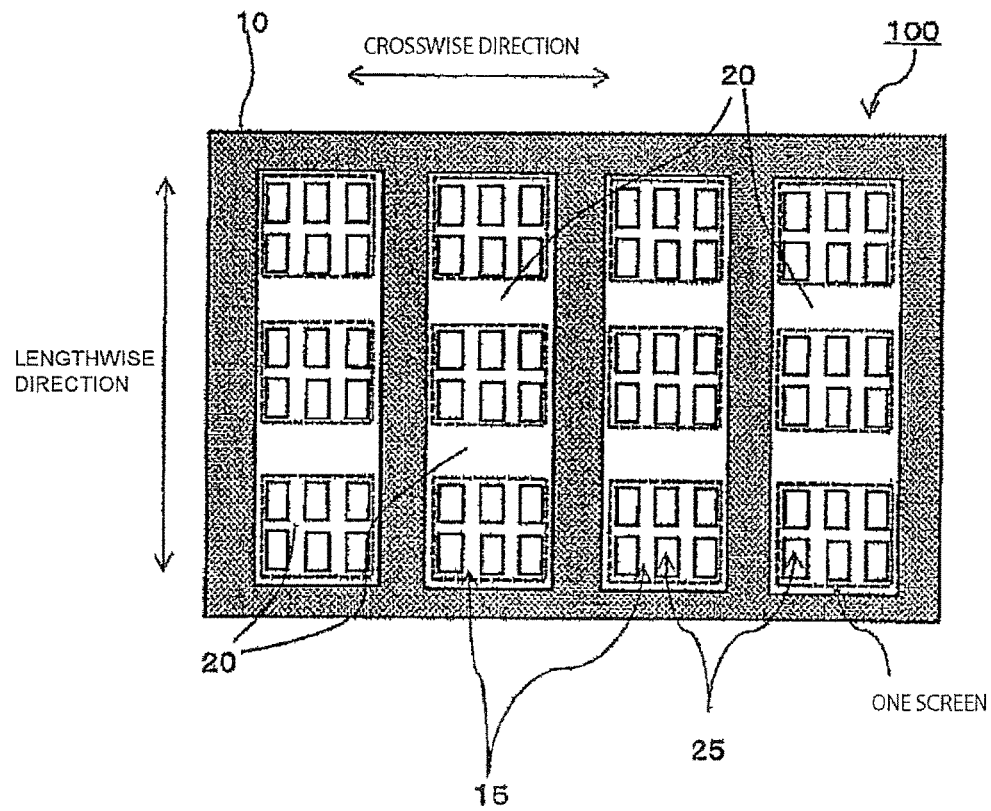

As shown in FIG. 10, the vapor deposition mask 100 of Embodiment (A) is a vapor deposition mask for simultaneously forming vapor deposition patterns for a plurality of screens, and includes the metal mask 10 in which the plurality of metal mask openings 15 are provided and the resin mask 20, the metal mask being stacked on one surface of the resin mask, wherein the resin mask openings 25 needed for constituting the plurality of screens are provided in the resin mask 20, and each metal mask opening 15 is provided at a position overlapping with the entirety of at least one screen.

The vapor deposition mask 100 of Embodiment (A) is a vapor deposition mask used for simultaneously forming vapor deposition patterns for a plurality of screens, and one vapor deposition mask 100 can simultaneously form vapor deposition patterns compatible with a plurality of products. "Resin mask openings" stated for the vapor deposition mask of Embodiment (A) mean the pattern(s) to be produced using the vapor deposition mask 100 of Embodiment (A). For example, when the vapor deposition mask is used for forming an organic layer in an organic EL display, the shape of the resin mask openings 25 is the shape of the organic layer. Moreover, "one screen" is constituted of an aggregate of the resin mask openings 25 corresponding to one product, and when the one product is an organic EL display, an aggregate of organic layers needed for forming the one organic EL display, in other words, an aggregate of resin mask openings 25 to be the organic layers is "one screen". Further, in the vapor deposition mask 100 of Embodiment (A), in order to simultaneously form the vapor deposition patterns for the plurality of screens, the aforementioned "one screen" is arranged for each of the plurality of screens in the resin mask 20 at predetermined intervals. Namely, in the resin mask 20, the resin mask openings 25 needed for constituting the plurality of screens are provided.

The vapor deposition mask of Embodiment (A) includes the metal mask 10 in which the plurality of metal mask openings 15 are provided and the resin mask, the metal mask being provided on one surface of the resin mask, wherein each metal mask opening 15 is provided at a position overlapping with the entirety of at least one screen. In other words, between the resin mask openings 25 needed for constituting one screen, metal line portions that include the same length as the length of the metal mask opening 15 in the lengthwise direction and include the same thickness as that of the metal mask 10 between the resin mask openings 25 adjacent in the crosswise direction, or metal line portions that include the same length as the length of the metal mask opening 15 in the crosswise direction and include the same thickness as that of the metal mask 10 between the resin mask openings 25 adjacent in the lengthwise direction do not exist. Hereafter, the metal line portions that include the same length as the length of the metal mask opening 15 in the lengthwise direction and include the same thickness as that of the metal mask 10 and the metal line portions that include the same length as the length of the metal mask opening 15 in the crosswise direction and include the same thickness as that of the metal mask 10 are sometimes collectively referred to simply as metal line portions.

According to the vapor deposition mask 100 of Embodiment (A), even when the dimension of the resin mask openings 25 needed for constituting one screen and the pitch between the resin mask openings 25 constituting one screen are made small, for example, even when the dimension of the resin mask openings 25 and the pitch between the resin mask openings 25 are made extremely fine in order to form a screen exceeding 400 ppi, interference due to metal line portions can be prevented and an image with high definition can be formed. Notably, when one screen is divided by a plurality of metal mask openings, in other words, when the metal line portions including the same thickness as that of the metal mask 10 exist between the resin mask openings 25 constituting one screen, as the pitch between the resin mask openings 25 constituting one screen becomes smaller, the metal line portions existing between the resin mask openings 25 more become a hindrance in forming a vapor deposition pattern on a vapor deposition target and the vapor deposition pattern with high definition becomes more difficult to be formed. In other words, when the metal line portions including the same thickness as that of the metal mask 10 exist between the resin mask openings 25 constituting one screen, the metal line portions cause generation of a shadow when setting the frame-equipped vapor deposition mask, which results in difficulty of formation of a screen with high definition.

Next, referring to FIG. 10 to FIG. 13(b), the resin mask openings 25 constituting one screen are exemplarily described. Notably, a region enclosed by a broken line in the modes shown in the figures is one screen. While in the modes shown in the figures, an aggregate of a small number of resin mask openings 25 is one screen for convenience of description, but not limited to these modes, for example, the resin mask openings 25 for millions of pixels may exist in one screen, where one resin mask opening 25 is one pixel.

In the mode shown in FIG. 10, one screen is constituted of an aggregate, of resin mask openings 25, in which a plurality of resin mask openings 25 are provided in the lengthwise direction and the crosswise direction. In the mode shown in FIG. 11, one screen is constituted of an aggregate, of resin mask openings 25, in which a plurality of resin mask openings 25 are provided in the crosswise direction. Moreover, in the mode shown in FIG. 12, one screen is constituted of an aggregate, of resin mask openings 25, in which a plurality of resin mask openings 25 are provided in the lengthwise direction. Further, in FIG. 10 to FIG. 12, the metal mask opening 15 is provided at a position overlapping with the entirety of one screen.

As described above, the metal mask opening 15 may be provided at a position overlapping with only one screen, or as shown in FIGS. 13(a) and 13(b), may be provided at a position overlapping with the entirety of two or more screens. In FIG. 13(a), in the vapor deposition mask 100 shown in FIG. 10, the metal mask opening 15 is provided at a position overlapping with the entirety of two screens continuous in the crosswise direction. In FIG. 13(b), the metal mask opening 15 is provided at a position overlapping with the entirety of three screens continuous in the lengthwise direction.

Next, exemplified by the mode shown in FIG. 10, pitches between the resin mask openings 25 constituting one screen and pitches between the screens are described. The pitches between the resin mask openings 25 constituting one screen and the dimension of the resin mask opening 25 are not specially limited but can be properly set depending on a pattern to be produced by vapor deposition. For example, when forming a vapor deposition pattern with high definition of 400 ppi, a pitch (P1) in the crosswise direction and a pitch (P2) in the lengthwise direction between the adjacent resin mask openings 25 out of the resin mask openings 25 constituting one screen are about 60 µm. Moreover, the dimension of the resin mask opening is within a range not less than about 500 $\mu m^2$ and not more than about 1000 $\mu m^2$. Moreover, one resin mask opening 25 is not limited to correspond to one pixel but, for example, a plurality of pixels can also be collectively one resin mask opening 25 depending on a pixel arrangement.

While a pitch (P3) in the crosswise direction and a pitch (P4) in the lengthwise direction between the screens are not specially limited but, as shown in FIG. 10, when one metal mask opening 15 is provided at the position overlapping with the entirety of one screen, metal line portions are to exist between the screens. Accordingly, when the pitch (P4) in the lengthwise direction and the pitch (P3) in the crosswise direction between the screens are smaller than or substantially equal to the pitch (P2) in the lengthwise direction and the pitch (P1) in the crosswise direction of the resin mask openings 25 provided in one screen, the metal line portions existing between the screens are liable to break. Accordingly, with this point taken into consideration, the pitch (P3, P4) between the screens is preferably wider than the pitch (P1, P2) between the resin mask openings 25 constituting one screen. The pitch (P3, P4) between the screens is exemplarily within a range not less than about 1 mm and not more than about 100 mm. Notably, the pitch between the screens means the pitch between the adjacent resin mask openings in one screen and another screen adjacent to the one screen. The same holds true for the pitch between the resin mask openings 25 and the pitch between the screens in the vapor deposition mask of Embodiment (B) mentioned later.

Notably, as shown in FIGS. 13(a)-(b), when one metal mask opening 15 is provided at the position overlapping with the entirety of two or more screens, metal line portions constituting the inner wall surfaces of the metal mask opening are not to exist between the plurality of screens provided in the one metal mask opening 15. Accordingly, in this case, the pitch between the two or more screens provided at the position overlapping with the one metal mask opening 15 may be substantially equal to the pitch between the resin mask openings 25 constituting one screen.

Moreover, on the resin mask 20, grooves (not shown) extending in the lengthwise direction or the crosswise direction of the resin mask 20 may be formed. While in the case of application of heat in vapor deposition, there is a possibility that the resin mask 20 undergoes thermal expansion, and thereby, changes in dimension and position of the resin mask opening 25 arise, by forming the grooves, they can absorb the expansion of the resin mask, and can prevent the changes in dimension and position of the resin mask opening 25 caused by the resin mask 20 expanding in a predetermined direction as a whole due to accumulation of thermal expansions arising in portions in the resin mask. Formation positions of the grooves are not limited but they may be provided between the resin mask openings 25 constituting one screen and at positions overlapping with the resin mask openings 25, but they are preferably provided between the screens. Moreover, the grooves may be provided on one surface of the resin mask, for example, only on the surface on the side that is in contact with the metal mask, or may be provided only on the surface on the side that is not in contact with the metal mask. Otherwise, they may be provided on both surfaces of the resin mask 20.

Moreover, the grooves extending in the lengthwise direction may be between the adjacent screens, or the grooves extending in the crosswise direction may be formed between the adjacent screens. Furthermore, the grooves can also be formed in a mode combining these.

The depth and the width of the grooves are not specially limited but, since the rigidity of the resin mask 20 tends to decrease in the case where the depth of the grooves is too large and in the case where the width thereof is too large, they are needed to be set with this point taken into consideration. Moreover, the sectional shape of the grooves is not specially limited but only has to be arbitrarily selected as a U-shape, a V-shape or the like with the processing method and the like taken into consideration. The same holds true for the vapor deposition mask of Embodiment (B).

<Vapor Deposition Mask of Embodiment (B)>

Figure 14:
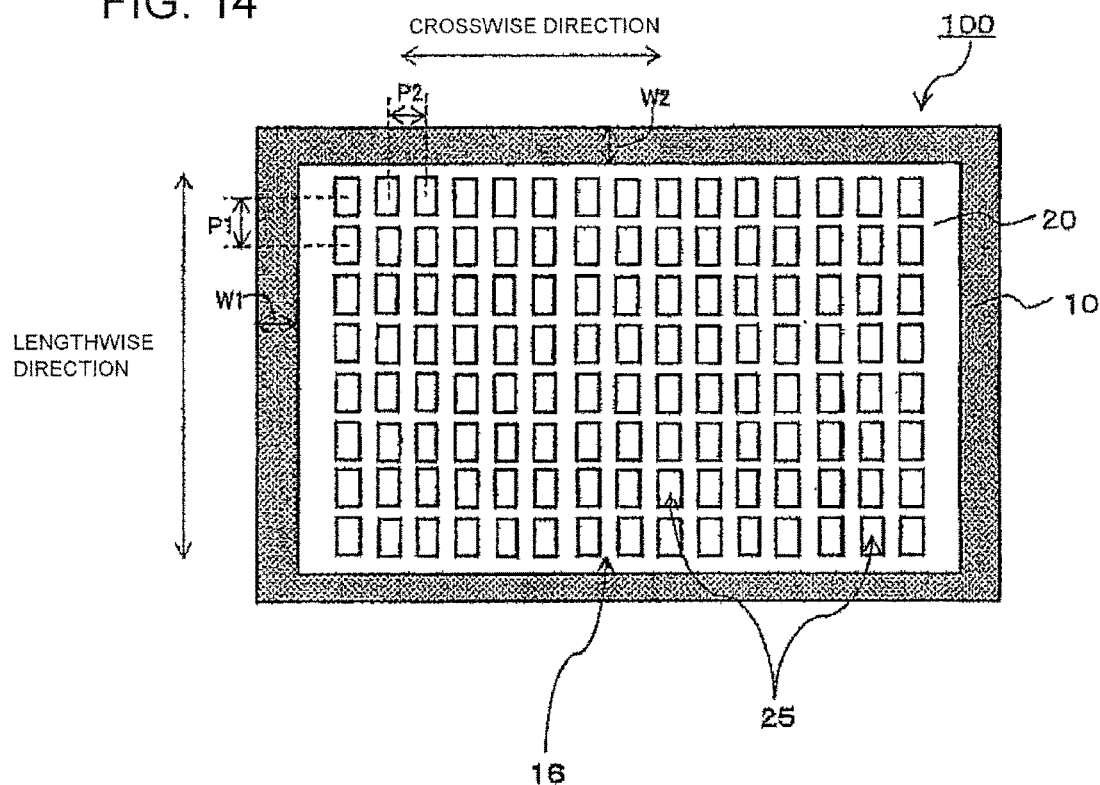
FIG. 14 is an elevation view of a vapor deposition mask of Embodiment (B) as seen from the metal mask side in plan view.

Next, a vapor deposition mask of Embodiment (B) is described. As shown in FIG. 14, a vapor deposition mask of Embodiment (B) includes the metal mask 10 in which one metal mask opening (one hole 16) is provided and the resin mask 20 in which the plurality of resin mask openings 25 corresponding to a pattern to be produced by vapor deposition are provided, the metal mask being stacked on one surface of the resin mask, wherein all of the plurality of resin mask openings 25 are provided at a position overlapping with the one hole provided in the metal mask 10.

The resin mask openings 25 stated for the vapor deposition mask of Embodiment (B) mean resin mask openings needed for forming a vapor deposition pattern on a vapor deposition target, and resin mask openings not needed for forming the vapor deposition pattern on the vapor deposition target may be provided at a position not overlapping with the one hole 16. Notably, FIG. 14 is an elevation view which exemplarily shows the vapor deposition mask of Embodiment (B) and is of the vapor deposition mask as seen from the metal mask side.

In the vapor deposition mask 100 of Embodiment (B), the metal mask 10 including the one hole 16 is provided on the resin mask 20 including the plurality of resin mask openings 25, and all of the plurality of resin mask openings 25 are provided at a position overlapping with the one hole 16. In the vapor deposition mask 100 of Embodiment (B) with this configuration, metal line portions that include the same thickness as the thickness of the metal mask or a larger thickness than the thickness of the metal mask do not exist between the resin mask openings 25. Hence, as described for the aforementioned vapor deposition mask of Embodiment (A), a vapor deposition pattern with high definition can be formed to match the dimensions of the resin mask openings 25 provided in the resin mask 20 without suffering interference of metal line portions.

Moreover, according to the vapor deposition mask of Embodiment (B), there is almost no influence of a shadow even when the thickness of the metal mask 10 is made large. Hence, the thickness of the metal mask 10 can be made larger to such an extent that durability and handling ability are sufficiently satisfied. Durability and handling ability can be improved while enabling formation of a vapor deposition pattern with high definition.

The resin mask 20 in the vapor deposition mask of Embodiment (B) is constituted of resin, in which as shown in FIG. 14, the plurality of resin mask openings 25 corresponding to a pattern to be produced by vapor deposition are provided at a position overlapping with the one hole 16. The resin mask openings 25 correspond to the pattern to be produced by vapor deposition, and by a vapor deposition material which is released from a vapor deposition source passing through the resin mask openings 25, the vapor deposition pattern corresponding to the resin mask openings 25 is formed on the vapor deposition target. Notably, while in the mode shown in the figure, the resin mask openings arranged in a plurality of rows in the lengthwise direction and the crosswise direction are exemplarily described, they may be arranged only in the lengthwise direction or in the crosswise direction.

"One screen" in the vapor deposition mask 100 of Embodiment (B) means an aggregate of resin mask openings 25 corresponding to one product, and when the one product is an organic EL display, an aggregate of organic layers needed for forming one organic EL display, in other words, an aggregate of resin mask openings 25 to be the organic layers is "one screen". While the vapor deposition mask of Embodiment (B) may be constituted of only "one screen" or may be provided by arranging the "one screen" for each of a plurality of screens, in the case where the "one screen" is arranged for each of the plurality of screens, the resin mask openings 25 are preferably provided at predetermined intervals on a screen-by-screen basis (refer to FIG. 10 for the vapor deposition mask of Embodiment (A)). The mode of "one screen" is not specially limited but, for example, the one screen can also be constituted of millions of resin mask openings 25, where one resin mask opening 25 is one pixel.

The metal mask 10 in the vapor deposition mask 100 of Embodiment (B) is constituted of metal and includes the one hole 16. Further, in an embodiment of the present invention, the one hole 16 is disposed at a position overlapping with all of the resin mask openings 25 as seen head-on of the metal mask 10, in other words, at a position where all of the resin mask openings 25 arranged in the resin mask 20 can be seen.

Figure 15:
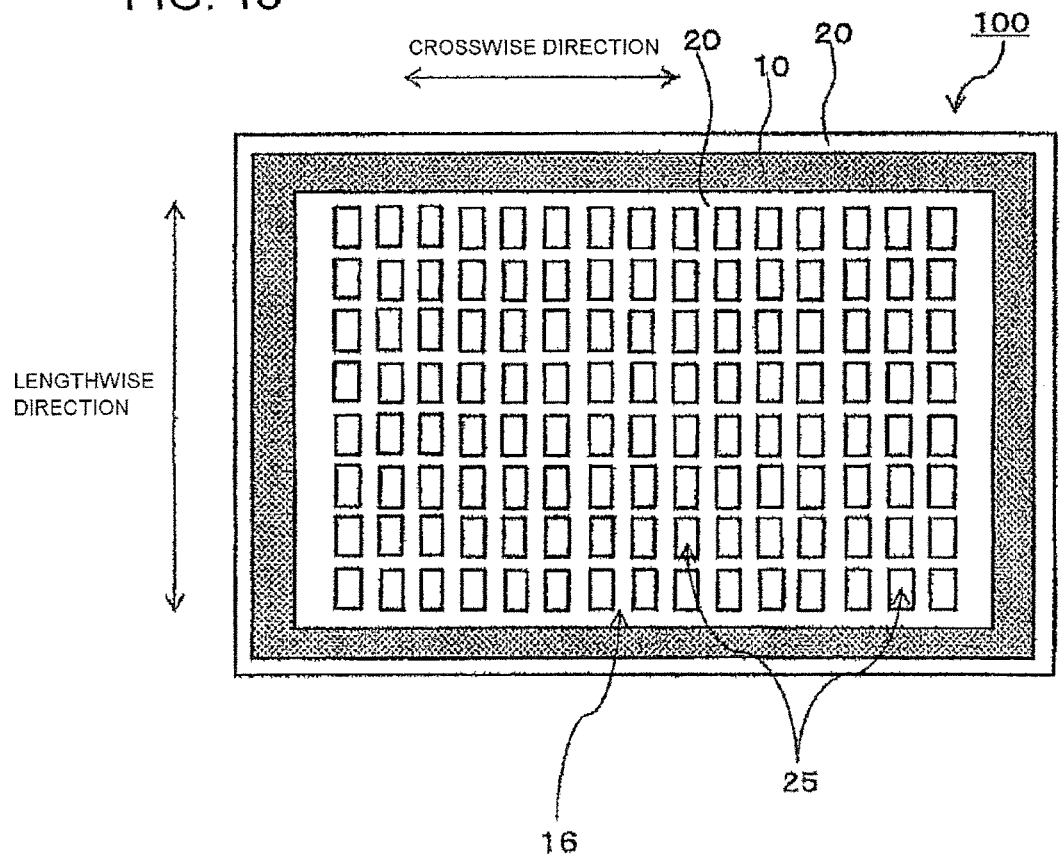
FIG. 15 is an elevation view of a vapor deposition mask of Embodiment (B) as seen from the metal mask side in plan view.

The metal portion constituting the metal mask 10, that is, the portion thereof other than the one hole 16 may be provided along the outer edge of the vapor deposition mask 100 as shown in FIG. 14, or the dimension of the metal mask 10 may be made smaller than that of the resin mask 20 to expose an outer circumferential portion of the resin mask 20 as shown in FIG. 15. Moreover, the dimension of the metal mask 10 may be made larger than that of the resin mask 20, so that a part of the metal portion is caused to protrude outward in the crosswise direction of the resin mask or outward in the lengthwise direction thereof. Notably, in any cases, the dimension of the one hole 16 is configured to be smaller than the dimension of the resin mask 20.

While a width (W1), in the crosswise direction, and a width (W2), in the lengthwise direction, of the metal portion constituting the wall surface of the one hole 16 of the metal mask 10 shown in FIG. 14 are not specially limited but, as the width W1, W2 is made smaller, durability and handling ability tend to deteriorate more. Accordingly, W1 and W2 are preferably widths by which durability and handling ability are sufficiently satisfied. While appropriate widths can be properly set depending on the thickness of the metal mask 10, as an example of preferable widths, both W1 and W2 are within a range of not less than about 1 mm and not more than about 100 mm, which are similar to those for the metal mask in the vapor deposition mask of Embodiment (A).

Accordingly, in the method for producing a vapor deposition mask according to an embodiment of the present disclosure, the position where the protective sheet 30 is provided on the other surface of the resin plate 20A, irradiation with laser light in the step of forming the resin mask openings 25, and the like are preferably determined such that the vapor deposition mask produced in the final stage is in the preferable mode described above. Moreover, when the protective sheet 30 is provided on the other surface of the resin plate 20A, the dimension thereof, and the position where it is disposed are preferably determined such that the vapor deposition mask produced in the final stage is in the preferable mode described above.

Moreover, in the method for producing a vapor deposition mask according to another embodiment of the present disclosure, the position where the protective sheet 30 is adsorbed on the other surface of the resin plate 20A, irradiation with laser light in the step of forming the resin mask openings 25, and the like are preferably determined such that the vapor deposition mask produced in the final stage is in the preferable mode described above. Moreover, when the protective sheet 30 is adsorbed on the other surface of the resin plate 20A, the dimension thereof, and the position where it is adsorbed are preferably determined such that the vapor deposition mask produced in the final stage is in the preferable mode described above.

Figure 16:
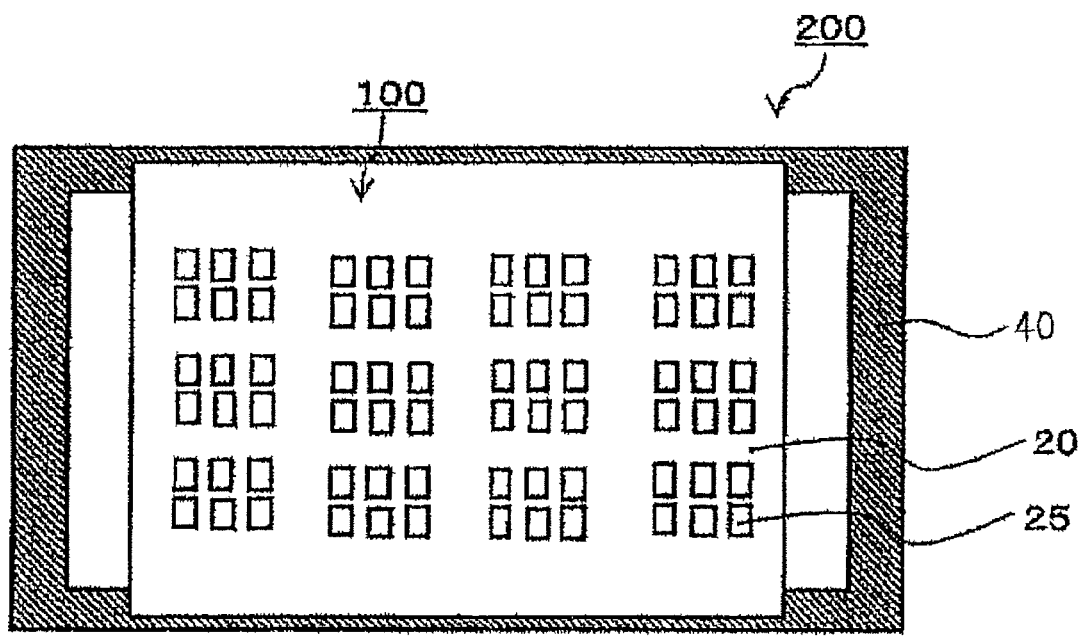
FIG. 16 is an elevation view of a frame-equipped vapor deposition mask as seen from the resin mask side in plan view.
Figure 17:
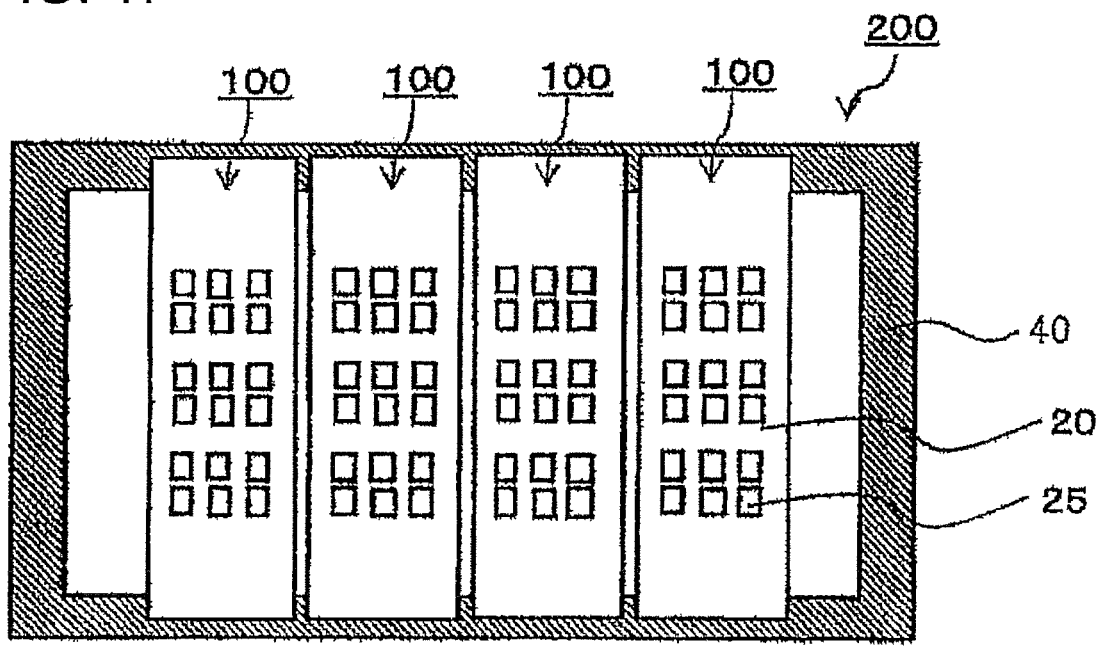
FIG. 17 is an elevation view of a frame-equipped vapor deposition mask as seen from the resin mask side in plan view.

Moreover, using the method for producing a vapor deposition mask according to an embodiment of the present disclosure or the method for producing a vapor deposition mask according to another embodiment of the present disclosure, a frame-equipped vapor deposition mask can also be obtained. FIG. 16 and FIG. 17 are elevation views of frame-equipped vapor deposition masks 200 obtained by fixing the vapor deposition masks obtained by the method for producing a vapor deposition mask according to an embodiment of the present disclosure and the method for producing a vapor deposition mask according to another embodiment of the present disclosure to frames 40 as seen from the resin mask side. In the frame-equipped vapor deposition mask 200, one vapor deposition mask 100 may be fixed to the frame 40 as shown in FIG. 16, or a plurality of vapor deposition masks 100 may be fixed to the frame 40 as shown in FIG. 17. The frame-equipped vapor deposition mask 200 can be obtained by fixing the vapor deposition mask obtained by the method for producing a vapor deposition mask according to an embodiment of the present disclosure or the method for producing a vapor deposition mask according to another embodiment of the present disclosure to the frame 40, or can be obtained by beforehand fixing the vapor deposition mask preparation body to the frame 40. Moreover, the frame-equipped vapor deposition mask in the mode shown in FIG. 17 can be obtained by fixing a plurality of vapor deposition masks obtained by the method for producing a vapor deposition mask according to an embodiment of the present disclosure or the method for producing a vapor deposition mask according to another embodiment of the present disclosure to the frame 40, or can be obtained by beforehand fixing a plurality of vapor deposition mask preparation bodies 60 to the frame 40.

<<Vapor Deposition Mask Preparation Body>>

Next, a vapor deposition mask preparation body according to an embodiment of the present disclosure is described. The vapor deposition mask preparation body according to an embodiment of the present disclosure is used for obtaining a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, wherein the metal mask 10 is provided on one surface of the resin plate 20A for obtaining the resin mask 20, and a protective sheet with peel strength not less than about 0.0004 N/10 mm and less than about 0.2 N/10 mm in conformity with JIS Z-0237:2009 is provided on the other surface of the resin plate 20A. The vapor deposition mask preparation body according to an embodiment of the present disclosure corresponds to the vapor deposition mask preparation body 60 (refer to FIG. 1(a)) described for "Step of Preparing Vapor Deposition Mask Preparation Body" in the aforementioned method for producing a vapor deposition mask according to an embodiment of the present disclosure, and its detailed description is omitted. According to the vapor deposition mask preparation body 60 according to an embodiment of the present disclosure, after the resin mask openings 25 are formed in the resin plate 20A of this vapor deposition mask preparation body 60 to obtain the resin mask 20, the protective sheet 30 is peeled off and removed from the resin mask 20, and thereby, the vapor deposition masks in various modes described above can be obtained.

A modification of the vapor deposition mask preparation body according to an embodiment of the present disclosure (hereinafter referred to as vapor deposition mask preparation body of a modification) is used, similarly to the aforementioned vapor deposition mask preparation body according to an embodiment of the present disclosure, for obtaining a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, wherein the metal plate 10A for obtaining the metal mask 10 is provided on one surface of the resin plate 20A for obtaining the resin mask 20, and a protective sheet with peel strength not less than about 0.0004 N/10 mm and less than about 0.2 N/10 mm in conformity with JIS Z-0237:2009 is provided on the other surface of the resin plate 20A. In other words, the vapor deposition mask preparation body 60 of a modification is different from the aforementioned vapor deposition mask preparation body according to an embodiment of the present disclosure only in that, in place of the metal mask 10 in which the metal mask openings 15 are formed, the metal plate 10A before the metal mask openings 15 are formed is provided on the one surface of the resin plate 20A. According to the vapor deposition mask preparation body of a modification, after the metal mask openings are formed in the metal plate 10A of this vapor deposition mask preparation body to obtain the metal mask 10, and after the resin mask openings 25 are formed by irradiating the resin plate 20A with laser light through the metal mask openings 15 having been formed from the metal mask 10 side to obtain the resin mask 20, the protective sheet 30 is peeled off and removed from the resin mask 20, and thereby, the vapor deposition masks in various modes described above are obtained.

According to the vapor deposition mask preparation body according to an embodiment of the present disclosure described above, when the resin mask openings 25 are formed in the resin plate 20A with laser light, "burrs" and "rubble" can be suppressed from arising on the formed resin mask 20, and a vapor deposition mask including the resin mask 20 in which the resin mask openings 25 with high definition are formed and the metal mask 10 including the metal mask openings 15, the resin mask and the metal mask being stacked, can be obtained.

A vapor deposition mask preparation body according to another embodiment of the present disclosure is used for obtaining a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, wherein the metal mask 10 is provided on one surface of the resin plate 20A for obtaining the resin mask 20, and the protective sheet 30 with self-adsorption and peelability is adsorbed on the other surface of the resin plate 20A. The vapor deposition mask preparation body according to another embodiment of the present disclosure corresponds to the vapor deposition mask preparation body 60 (refer to FIG. 1(a)) described for "Step of Preparing Vapor Deposition Mask Preparation Body" in the aforementioned method for producing a vapor deposition mask according to another embodiment of the present disclosure, and its detailed description is omitted. According to the vapor deposition mask preparation body 60 according to another embodiment of the present disclosure, after the resin mask openings 25 are formed in the resin plate 20A of this vapor deposition mask preparation body 60 to obtain the resin mask 20, the protective sheet 30 is peeled off and removed from the resin mask 20, and thereby, the vapor deposition masks in various modes described above can be obtained.

A modification of the vapor deposition mask preparation body according to another embodiment of the present disclosure (hereinafter referred to as vapor deposition mask preparation body of another modification) is used, similarly to the aforementioned vapor deposition mask preparation body according to another embodiment of the present disclosure, for obtaining a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, wherein the metal plate 10A for obtaining the metal mask 10 is provided on one surface of the resin plate 20A for obtaining the resin mask 20, and the protective sheet 30 with self-adsorption and peelability is adsorbed on the other surface of the resin plate 20A. In other words, the vapor deposition mask preparation body 60 of another modification is different from the aforementioned vapor deposition mask preparation body according to another embodiment of the present disclosure only in that, in place of the metal mask 10 in which the metal mask openings 15 are formed, the metal plate 10A before the metal mask openings 15 are formed is provided on the one surface of the resin plate 20A. According to the vapor deposition mask preparation body of another modification, after the metal mask openings are formed in the metal plate 10A of this vapor deposition mask preparation body to obtain the metal mask 10, and after the resin mask openings 25 are formed by irradiating the resin plate 20A with laser light through the metal mask openings 15 having been formed from the metal mask 10 side to obtain the resin mask 20, the protective sheet 30 is peeled off and removed from the resin mask 20, and thereby, the vapor deposition masks in various modes described above are obtained.

According to the vapor deposition mask preparation body according to another embodiment of the present disclosure described above, when the resin mask openings 25 are formed in the resin plate 20A with laser light, "burrs" and "rubble" can be suppressed from arising on the formed resin mask 20, and a vapor deposition mask including the resin mask 20 in which the resin mask openings 25 with high definition are formed and the metal mask 10 including the metal mask openings 15, the resin mask and the metal mask being stacked, can be obtained.

<<Vapor Deposition Mask>>

Next, a vapor deposition mask according to an embodiment of the present disclosure is described. In the vapor deposition mask 100 according to an embodiment of the present disclosure, the metal mask 10 including the metal mask openings 15 is provided on one surface of the resin mask 20 including the resin mask openings 25, and a protective sheet 30 with peel strength not less than about 0.0004 N/10 mm and less than about 0.2 N/10 mm in conformity with JIS Z-0237:2009 is provided on the other surface of the resin mask 20 (refer to FIG. 19).

This vapor deposition mask 100 according to an embodiment of the present disclosure and the aforementioned vapor deposition mask preparation body according to an embodiment of the present disclosure have all in common except the resin mask 20 including the resin mask openings 25 in place of the resin plate 20A, and its detailed description is omitted.

Figure 19:
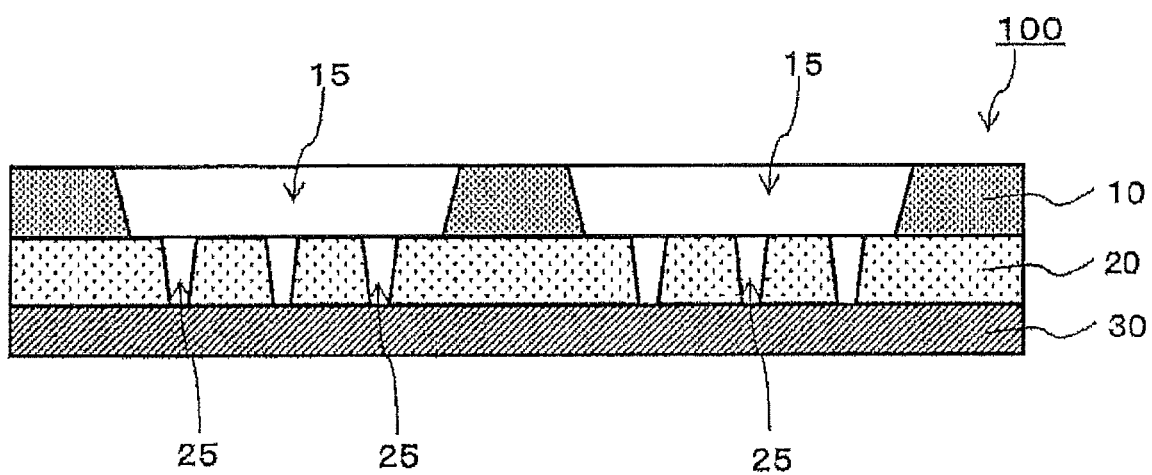
FIG. 19 is a schematic cross-sectional view of a vapor deposition mask of an embodiment.

Moreover, as shown in FIG. 19, in a vapor deposition mask according to another embodiment of the present disclosure, the metal mask 10 including the metal mask openings 15 is provided on one surface of the resin mask 20 including the resin mask openings 25, and the protective sheet 30 with self-adsorption and peelability is adsorbed on the other surface of the resin mask 20.

This vapor deposition mask according to another embodiment of the present disclosure and the aforementioned vapor deposition mask preparation body according to another embodiment of the present disclosure have all in common except the resin mask 20 including the resin mask openings 25 in place of the resin plate 20A, and its detailed description is omitted.

<<Method for Producing Organic Semiconductor Element>>

Next, a method for producing an organic semiconductor element according to an embodiment of the present disclosure is described. The method for producing an organic semiconductor element according to an embodiment of the present disclosure includes a step of forming a vapor deposition pattern on a vapor deposition target using a frame-equipped vapor deposition mask in which a vapor deposition mask is fixed to a frame, wherein in the step of forming the vapor deposition pattern, the vapor deposition mask fixed to the frame is the vapor deposition mask produced by the method for producing a vapor deposition mask according to an embodiment of the present disclosure described above.

Moreover, a method for producing an organic semiconductor element according to another embodiment of the present disclosure includes a step of forming a vapor deposition pattern on a vapor deposition target using a frame-equipped vapor deposition mask in which a vapor deposition mask is fixed to a frame, wherein in the step of forming the vapor deposition pattern, the vapor deposition mask fixed to the frame is the vapor deposition mask produced by the method for producing a vapor deposition mask according to another embodiment of the present disclosure described above.

The method for producing an organic semiconductor element according to an embodiment of the present disclosure and the method for producing an organic semiconductor element according to another embodiment of the present disclosure, each of which includes the step of forming the vapor deposition pattern by a vapor deposition method using the frame-equipped vapor deposition mask, include an electrode forming step, an organic layer forming step, a counter electrode forming step, a sealing layer forming step and the like in which electrodes are formed on a substrate, and in any of the steps, a vapor deposition pattern is formed on the substrate by the vapor deposition method using the frame-equipped vapor deposition mask. For example, in the case where the vapor deposition method using the frame-equipped vapor deposition mask is applied to each of light-emitting layer forming steps for colors of R (red), G (green) and B (blue) in an organic EL device, vapor deposition patterns are formed for light-emitting layers for the colors on the substrate. Notably, the method for producing an organic semiconductor element according to an embodiment of the present disclosure and the method for producing an organic semiconductor element according to another embodiment of the present disclosure are not limited to be applied to these steps, but to any steps in conventionally known production of an organic semiconductor element using a vapor deposition method.

In the method for producing an organic semiconductor element according to an embodiment of the present disclosure and the method for producing an organic semiconductor element according to another embodiment of the present disclosure, the frame-equipped vapor deposition mask which is used in the aforementioned step of forming the vapor deposition pattern and in which the vapor deposition mask is fixed to the frame is the vapor deposition mask produced by the method for producing a vapor deposition mask according to an embodiment of the present disclosure or the method for producing a vapor deposition mask according to another embodiment of the present disclosure described above, and its detailed description is omitted. According to the method for producing a vapor deposition mask according to an embodiment of the present disclosure and the method for producing a vapor deposition mask according to another embodiment of the present disclosure, a vapor deposition mask including the resin mask 20 in which the resin mask openings 25 corresponding to a pattern to be produced by vapor deposition are formed with excellent precision can be obtained, and hence, according to the method for producing an organic semiconductor element using the frame-equipped vapor deposition mask in which this vapor deposition mask is fixed to the frame, an organic semiconductor element including a high definition pattern can be formed. As organic semiconductor elements produced by the method for producing an organic semiconductor element according to an embodiment of the present disclosure and the method for producing an organic semiconductor element according to another embodiment of the present disclosure, for example, organic layers, light-emitting layers, cathode electrodes and the like of organic EL elements can be cited. In particular, the method for producing an organic semiconductor element according to an embodiment of the present disclosure can be preferably used for production of R (red), G (green) and B (blue) light-emitting layers of organic EL elements which require pattern precision with high definition.

<<Method for Producing Organic EL Display>>

Next, a method for producing an organic EL display (organic electroluminescence display) according to an embodiment of the present disclosure (hereinafter referred to as method for producing an organic EL display according to the present disclosure) is described. In the method for producing an organic EL display according to the present disclosure, the organic semiconductor element produced by the method for producing an organic semiconductor element according to the present disclosure described above is used in a step of producing the organic EL display.

Moreover, in a method for producing an organic EL display according to another embodiment of the present disclosure, the organic semiconductor element produced by the method for producing an organic semiconductor element according to another embodiment of the present disclosure described above is used in a step of producing the organic EL display.

Figure 18:
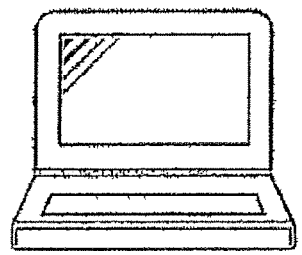
FIGS. 18(a)-(g) show diagrams showing examples of devices including organic EL displays.
Figure 18:
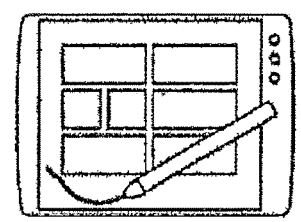
Figure 18:
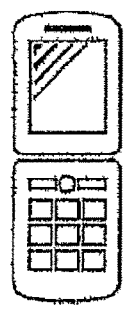
Figure 18:
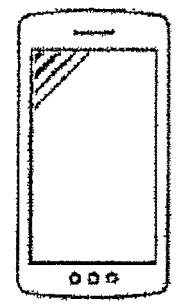
Figure 18:
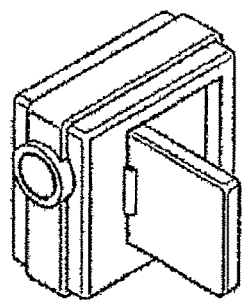
Figure 18:
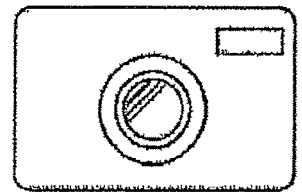
Figure 18:
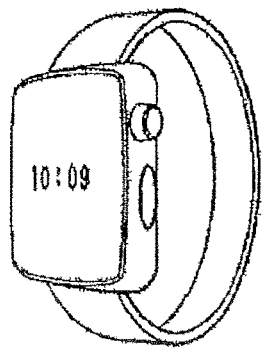

As the organic EL displays in which the organic semiconductor elements produced by the aforementioned method for producing an organic semiconductor element according to the present disclosure and the method for producing an organic EL display according to another embodiment of the present disclosure are used, for example, organic EL displays used for a notebook-sized personal computer (refer to FIG. 18(a)), a tablet terminal (refer to FIG. 18(b)), a mobile phone (refer to FIG. 18(c)), a smartphone (refer to FIG. 18(d)), a video camera (refer to FIG. 18(e)), a digital camera (refer to FIG. 18(f)), a smartwatch (refer to FIG. 18(g)) and the like can be cited.

REFERENCE SIGNS LIST

100 Vapor deposition mask
10A Metal plate
10 Metal mask
15 Metal mask opening
20A Resin plate
20 Resin mask
30 Protective sheet
25 Resin mask opening
60 Vapor deposition mask preparation body
62 Resist material
64 Resist pattern

The invention claimed is:

1. A method for producing a vapor deposition mask including a metal mask in which a metal mask opening is formed and a resin mask in which a resin mask opening corresponding to a pattern to be produced by vapor deposition is formed at a position overlapping with the metal mask opening, the metal mask and the resin mask being stacked, the method comprising:
a step of preparing a vapor deposition mask preparation body in which the metal mask is provided on one surface of a resin plate for obtaining the resin mask, and a protective sheet with self-adsorption and peelability is adsorbed on the other surface of the resin plate;
a step of irradiating, with respect to the vapor deposition mask preparation body, the resin plate with laser light from the metal mask side to form the resin mask opening corresponding to the pattern to be produced by vapor deposition in the resin plate; and
a step of peeling off the protective sheet from the resin mask in which the resin mask opening corresponding to the pattern to be produced by vapor deposition is formed.

2. The method for producing a vapor deposition mask according to claim 1, wherein the protective sheet adsorbed on the other surface of the resin plate is a protective sheet containing any one or both of a silicone-based resin and a urethane-based resin.

3. The method for producing a vapor deposition mask according to claim 1, wherein the vapor deposition mask preparation body is a vapor deposition mask preparation body in which the metal mask is provided on one surface of the resin plate for obtaining the resin mask, and a plurality of the protective sheets are adsorbed on the other surface of the resin plate.

4. The method for producing a vapor deposition mask according to claim 2, wherein the vapor deposition mask preparation body is a vapor deposition mask preparation body in which the metal mask is provided on one surface of the resin plate for obtaining the resin mask, and a plurality of the protective sheets are adsorbed on the other surface of the resin plate.

5. The method for producing a vapor deposition mask according to claim 1, wherein the resin plate is made of a resin material having a thermal expansion coefficient of 16 ppm/° C. or less.

6. The method for producing a vapor deposition mask according to claim 1, wherein the resin plate is made of a resin material having a rate of humidity absorption of 1.0% or less.

7. The method for producing a vapor deposition mask according to claim 1, wherein the resin plate is made of a resin material having a thermal expansion coefficient of 16 ppm/° C. or less and a rate of humidity absorption of 1.0% or less.

8. The method for producing a vapor deposition mask according to claim 1, wherein a thickness of the resin plate is 3 µm to 25 µm inclusive.

9. The method for producing a vapor deposition mask according to claim 1, wherein a thickness of the resin plate is 4 µm to 8 µm inclusive.

10. The method for producing a vapor deposition mask according to claim 1, wherein the pattern is a high-definition pattern exceeding 400 ppi.

11. The method for producing a vapor deposition mask according to claim 1, wherein a cross-sectional shape of the resin mask opening broadens toward the metal mask side.

12. The method for producing a vapor deposition mask according to claim 1, wherein a thickness of the metal mask is 5 µm to 100 µm inclusive.

13. The method for producing a vapor deposition mask according to claim 1, wherein a thickness of the metal mask is 5 µm to 35 µm inclusive.

14. The method for producing a vapor deposition mask according to claim 1, wherein the metal mask is made of an invar material.

15. The method for producing a vapor deposition mask according to claim 1, wherein a cross-sectional shape of the metal mask opening broadens toward a vapor deposition source.

* * * * *